US011057055B2

United States Patent
Wu et al.

(10) Patent No.: US 11,057,055 B2
(45) Date of Patent: Jul. 6, 2021

(54) ENCODING AND DECODING USING GOLAY-BASED BLOCK CODES

(71) Applicant: QUALCOMM Incorporated, San Diego, CA (US)

(72) Inventors: Liangming Wu, Beijing (CN); Changlong Xu, Beijing (CN); Jing Jiang, San Diego, CA (US); Chao Wei, Beijing (CN); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/476,053

(22) PCT Filed: Jan. 8, 2018

(86) PCT No.: PCT/CN2018/071772
§ 371 (c)(1),
(2) Date: Jul. 3, 2019

(87) PCT Pub. No.: WO2018/127174
PCT Pub. Date: Jul. 12, 2018

(65) Prior Publication Data
US 2019/0349010 A1 Nov. 14, 2019

(30) Foreign Application Priority Data

Jan. 9, 2017 (WO) ............... PCT/CN2017/070682
Mar. 30, 2017 (WO) ............... PCT/CN2017/078797

(51) Int. Cl.
*H03M 13/00* (2006.01)
*H03M 13/15* (2006.01)
(Continued)

(52) U.S. Cl.
CPC ... *H03M 13/1505* (2013.01); *H03M 13/1174* (2013.01); *H03M 13/618* (2013.01); *H04L 1/0041* (2013.01)

(58) Field of Classification Search
CPC ......... H03M 13/1505; H03M 13/1174; H03M 13/618; H04L 1/0041
See application file for complete search history.

(56) References Cited

U.S. PATENT DOCUMENTS

2007/0291822 A1  12/2007  Staley et al.
2008/0075176 A1  3/2008  Karr et al.
(Continued)

FOREIGN PATENT DOCUMENTS

CN  101860415 A  10/2010
CN  102498676 A  6/2012
(Continued)

OTHER PUBLICATIONS

Huawei: "Cell-Specific Signals for Initial Synchronization and Cell Identification", 3GPP TSG RAN WG1 LTE Ad Hoc, R1-060225, Jan. 25, 2006, 11 pages.
(Continued)

*Primary Examiner* — Samir W Rizk
(74) *Attorney, Agent, or Firm* — Loza & Loza, LLP/Qualcomm

(57) ABSTRACT

Wireless communication devices are adapted to employ Golay-based matrices for encoding a wireless transmissions. According to at least one example, a wireless communication device can identify an information vector to be transmitted as a wireless communication. A Golay-based generator matrix may be selected based on a length of the information vector, where the selected Golay-based generator matrix is generated by shortening a Golay generator matrix by removing a plurality of columns of systematic bits
(Continued)

and a plurality of rows to obtain the shortened generator matrix, and extending the shortened generator matrix to obtain an extended generator matrix by adding columns to at least the systematic bits and appending rows to obtain a desired matrix size. A respective bit value may be determined for bits in each added column and for at least some of the bits in each appended row. Other aspects, embodiments, and features are also included.

30 Claims, 17 Drawing Sheets

(51) Int. Cl.
  *H03M 13/11* (2006.01)
  *H04L 1/00* (2006.01)

(56) References Cited

U.S. PATENT DOCUMENTS

2009/0217139 A1* 8/2009 Roh ............... H03M 13/03
                                                  714/783
2014/0254709 A1 9/2014 Flowers

FOREIGN PATENT DOCUMENTS

| | | |
|---|---|---|
| CN | 104468097 A | 3/2015 |
| WO | 9827659 A1 | 6/1998 |
| WO | 2009084891 A2 | 7/2009 |

OTHER PUBLICATIONS

International Search Report and Written Opinion—PCT/CN2018/071772—ISA/EPO—dated Mar. 27, 2018.

International Search Report and Written Opinion—PCT/CN2017/070682—ISA/EPO—dated Oct. 11, 2017.

Rui X., "An Algorithm of Expand—Golay Encode and Decode", Communication Technology, Dec. 31, 2003, No. 6, pp. 28-29.

Supplementary European Search Report—EP18735875—Search Authority—Munich—dated Sep. 29, 2020.

* cited by examiner

| $i$ | M$(i,0)$ | M$(i,1)$ | M$(i,2)$ | M$(i,3)$ | M$(i,4)$ | M$(i,5)$ | M$(i,6)$ | M$(i,7)$ | M$(i,8)$ | M$(i,9)$ | M$(i,10)$ | M$(i,11)$ |
|---|---|---|---|---|---|---|---|---|---|---|---|---|
| 0 | 1 | 0 | 0 | 0 | 0 | 0 | 0 | 0 | 0 | 0 | 0 | 0 |
| 1 | 0 | 1 | 0 | 0 | 0 | 0 | 0 | 0 | 0 | 0 | 0 | 0 |
| 2 | 0 | 0 | 1 | 0 | 0 | 0 | 0 | 0 | 0 | 0 | 0 | 0 |
| 3 | 0 | 0 | 0 | 1 | 0 | 0 | 0 | 0 | 0 | 0 | 0 | 0 |
| 4 | 0 | 0 | 1 | 0 | 1 | 0 | 0 | 0 | 0 | 0 | 0 | 0 |
| 5 | 1 | 0 | 0 | 1 | 1 | 1 | 0 | 0 | 0 | 0 | 0 | 0 |
| 6 | 0 | 1 | 0 | 1 | 1 | 0 | 1 | 0 | 0 | 0 | 0 | 0 |
| 7 | 1 | 1 | 1 | 0 | 0 | 0 | 0 | 1 | 0 | 0 | 0 | 0 |
| 8 | 0 | 1 | 1 | 1 | 1 | 1 | 1 | 1 | 1 | 0 | 0 | 0 |
| 9 | 1 | 0 | 1 | 0 | 1 | 0 | 0 | 0 | 1 | 1 | 0 | 0 |
| 10 | 1 | 0 | 1 | 1 | 1 | 1 | 0 | 1 | 1 | 0 | 1 | 0 |
| 11 | 1 | 1 | 0 | 0 | 1 | 1 | 0 | 1 | 1 | 0 | 0 | 1 |
| 12 | 1 | 0 | 0 | 0 | 1 | 1 | 1 | 0 | 1 | 1 | 0 | 1 |
| 13 | 0 | 0 | 0 | 1 | 1 | 1 | 0 | 1 | 1 | 0 | 1 | 1 |
| 14 | 0 | 0 | 1 | 1 | 1 | 0 | 1 | 1 | 0 | 1 | 0 | 1 |
| 15 | 0 | 1 | 1 | 1 | 0 | 1 | 1 | 0 | 1 | 0 | 0 | 1 |
| 16 | 1 | 1 | 1 | 0 | 1 | 1 | 0 | 1 | 0 | 0 | 0 | 1 |
| 17 | 1 | 1 | 0 | 1 | 1 | 0 | 1 | 0 | 0 | 0 | 1 | 1 |
| 18 | 1 | 0 | 1 | 1 | 0 | 1 | 0 | 0 | 0 | 1 | 1 | 1 |
| 19 | 0 | 1 | 1 | 0 | 1 | 0 | 0 | 0 | 1 | 1 | 1 | 1 |
| 20 | 1 | 1 | 0 | 1 | 0 | 0 | 0 | 1 | 1 | 1 | 0 | 1 |
| 21 | 1 | 0 | 1 | 0 | 0 | 0 | 1 | 1 | 1 | 0 | 1 | 1 |
| 22 | 0 | 1 | 0 | 0 | 0 | 1 | 1 | 1 | 0 | 1 | 1 | 1 |
| 23 | 1 | 1 | 1 | 1 | 1 | 1 | 1 | 1 | 1 | 1 | 1 | 0 |

| $i$ | M$(i,0)$ | M$(i,1)$ | M$(i,2)$ | M$(i,3)$ | M$(i,4)$ | M$(i,5)$ | M$(i,6)$ | M$(i,7)$ | M$(i,8)$ | M$(i,9)$ | M$(i,10)$ | M$(i,11)$ |
|---|---|---|---|---|---|---|---|---|---|---|---|---|
| 0 | 1 | 1 | 1 | 1 | 1 | 1 | 1 | 1 | 1 | 1 | 1 | 1 |
| 1 | 0 | 1 | 1 | 1 | 1 | 1 | 1 | 1 | 1 | 1 | 1 | 1 |
| 2 | 0 | 0 | 1 | 1 | 1 | 1 | 1 | 1 | 1 | 1 | 1 | 1 |
| 3 | 0 | 0 | 0 | 1 | 1 | 1 | 1 | 1 | 1 | 1 | 1 | 1 |
| 4 | 0 | 0 | 0 | 1 | 1 | 0 | 0 | 0 | 0 | 0 | 0 | 0 |
| 5 | 1 | 1 | 1 | 0 | 1 | 0 | 0 | 0 | 0 | 0 | 0 | 0 |
| 6 | 0 | 1 | 1 | 0 | 1 | 1 | 0 | 0 | 0 | 0 | 0 | 0 |
| 7 | 1 | 0 | 1 | 1 | 1 | 1 | 1 | 0 | 0 | 0 | 0 | 0 |
| 8 | 0 | 1 | 0 | 1 | 0 | 1 | 0 | 1 | 0 | 0 | 0 | 0 |
| 9 | 1 | 1 | 0 | 0 | 1 | 1 | 1 | 1 | 0 | 1 | 1 | 1 |
| 10 | 1 | 1 | 0 | 1 | 0 | 1 | 1 | 0 | 1 | 1 | 0 | 0 |
| 11 | 1 | 0 | 0 | 0 | 1 | 0 | 0 | 1 | 0 | 0 | 0 | 1 |
| 12 | 1 | 1 | 1 | 1 | 0 | 1 | 0 | 0 | 1 | 0 | 0 | 1 |
| 13 | 0 | 0 | 0 | 1 | 0 | 1 | 1 | 0 | 1 | 1 | 0 | 1 |
| 14 | 0 | 0 | 1 | 0 | 1 | 1 | 0 | 1 | 1 | 0 | 0 | 1 |
| 15 | 0 | 1 | 0 | 1 | 1 | 0 | 1 | 1 | 0 | 0 | 0 | 1 |
| 16 | 1 | 0 | 1 | 1 | 0 | 1 | 1 | 0 | 0 | 0 | 0 | 1 |
| 17 | 1 | 0 | 0 | 1 | 0 | 0 | 1 | 1 | 1 | 1 | 0 | 1 |
| 18 | 1 | 1 | 0 | 1 | 1 | 0 | 0 | 0 | 0 | 1 | 0 | 1 |
| 19 | 0 | 1 | 0 | 0 | 1 | 1 | 1 | 0 | 1 | 0 | 0 | 1 |
| 20 | 1 | 0 | 0 | 1 | 1 | 1 | 1 | 0 | 1 | 0 | 0 | 1 |
| 21 | 1 | 1 | 0 | 0 | 0 | 0 | 1 | 0 | 1 | 1 | 0 | 1 |
| 22 | 0 | 1 | 1 | 1 | 1 | 0 | 1 | 0 | 0 | 1 | 0 | 1 |
| 23 | 1 | 0 | 1 | 0 | 1 | 0 | 1 | 0 | 1 | 0 | 1 | 1 |
| 24 | 0 | 0 | 1 | 0 | 0 | 1 | 0 | 1 | 0 | 0 | 0 | 0 |
| 25 | 0 | 1 | 1 | 1 | 0 | 1 | 0 | 0 | 0 | 1 | 0 | 0 |
| 26 | 0 | 1 | 1 | 0 | 0 | 1 | 0 | 0 | 1 | 0 | 1 | 0 |
| 27 | 0 | 1 | 0 | 0 | 0 | 1 | 1 | 1 | 0 | 1 | 0 | 1 |
| 28 | 0 | 1 | 0 | 0 | 1 | 1 | 0 | 0 | 0 | 1 | 1 | 0 |
| 29 | 1 | 1 | 1 | 0 | 0 | 0 | 0 | 1 | 1 | 1 | 0 | 0 |
| 30 | 1 | 0 | 0 | 0 | 0 | 1 | 1 | 0 | 0 | 0 | 0 | 1 |
| 31 | 1 | 0 | 1 | 0 | 0 | 1 | 1 | 1 | 1 | 1 | 0 | 0 |

FIG. 18

ENCODING AND DECODING USING GOLAY-BASED BLOCK CODES

CROSS-REFERENCE TO RELATED APPLICATION(S)

This application is the U.S. national stage of PCT patent application number PCT/CN2018/071772 filed on Jan. 8, 2018, which claims priority to and the benefit of PCT patent application number PCT/CN2017/070682 filed on Jan. 9, 2017, and PCT patent application number PCT/CN2017/078797 filed on Mar. 30, 2017, the content of each of which is incorporated herein by reference.

TECHNICAL FIELD

The technology discussed below relates generally to wireless communication systems, and more particularly, to channel coding utilizing Golay codes in communication systems. Embodiments enable and provide improved and efficient wireless communication benefitting from the disclosed coding and error correction techniques.

INTRODUCTION

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

BRIEF SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

The technology discussed in this application relates to coding and in particular codes capable of use for error detection/correction. One type of discussed code is a linear error-correcting code called a Golay code. For future wireless communication networks beyond LTE, Golay codes present a potential opportunity for reliable and efficient information transfer with improved performance relative to other error correcting block codes.

According to at least one aspect of the present disclosure, wireless communication devices are provided to employ Golay-based generator matrices for block encoding. In at least one example, a wireless communication device may include a transceiver and a memory, each communicatively coupled with a processing circuit. The processing circuit may be configured to identify an information vector to be transmitted as a wireless communication. The processing circuit may further be configured to select a Golay-based generator matrix based on a length of the information vector. A selected Golay-based generator matrix can be generated at least in part by shortening a Golay generator matrix. For example, shortening may occur by removing a plurality of columns of systematic bits and a plurality of rows to obtain a shortened generator matrix. The shortened generator matrix can subsequently be extended by adding columns to at least the systematic bits and appending rows to obtain a desired matrix size. In some scenarios, a respective bit value may be determined for bits in each added column and for at least some of the bits in each appended row. The processing circuit may be further configured to encode the information vector utilizing the selected Golay-based generator matrix, and to transmit the encoded information vector as a codeword via the transceiver.

One or more further aspects of the disclosure provide methods of wireless communication, as well as means for performing such methods. According to one or more examples, such methods may include identifying an information vector to be transmitted as a wireless communication, and selecting a Golay-based generator matrix based on a length of the information vector. The selected Golay-based generator matrix may be generated at least in part by shortening a Golay generator matrix by removing a plurality of columns of systematic bits and a plurality of rows to obtain a shortened generator matrix. The shortened generator matrix may be extended by adding columns to at least the systematic bits and appending rows to obtain a desired matrix size. In some scenarios, a respective bit value may be determined for bits in each added column and for at least some of the bits in each appended row. The information vector may be encoded utilizing the selected Golay-based generator matrix. Further, the encoded information vector may be transmitted as a codeword.

Yet further aspects of the present disclosure provide processor-readable mediums including programming executable by a processing circuit. According to one or more examples, such programming may be adapted for causing a processing circuit to identify an information vector to be transmitted as a wireless communication, and select a Golay-based generator matrix based on a length of the information vector. The selected Golay-based generator matrix may be generated at least in part by shortening a Golay generator matrix by removing a plurality of columns of systematic bits and a plurality of rows to obtain a shortened generator matrix, and extending the shortened generator matrix to obtain an extended generator matrix by adding columns to at least the systematic bits and appending rows to obtain a desired matrix size, where a respective bit value is determined for bits in each added column and for at least some of the bits in each appended row. The programming may be further adapted for causing a processing circuit to encode the information vector utilizing the selected Golay-based generator matrix, and to transmit the encoded information vector.

Other aspects, features, and embodiments of the technology will become apparent to those of ordinary skill in the art, upon reviewing the following description of specific, exemplary embodiments in conjunction with the accompanying figures. While features of the technology discussed below may be described relative to certain embodiments and figures below, all embodiments can include one or more of the advantageous features discussed. While one or more embodiments may be discussed as having certain advantageous features, one or more of such features may also be used in accordance with the various embodiments discussed.

In similar fashion, while exemplary embodiments may be discussed below as device, system, or method embodiments it should be understood that such exemplary embodiments can be implemented in varying shapes, sizes, layouts, arrangements, circuits, devices, systems, and methods.

BRIEF DESCRIPTION OF THE DRAWINGS

FIG. 6 is table depicting a transposed version of the generator matrix from FIG. 5.

FIG. 9 depicts a Golay coding generator matrix shortened to (16, 4) according to at least one example.

FIG. 13 shows the (20, 7) generator matrix of FIG. 12 extended to (24, 7) with new columns.

FIG. 14 shows the (24, 7) generator matrix of FIG. 13 with new bit values derived for the extended bits.

FIG. 15 shows the (24, 12) generator matrix of FIG. 5 extended to (32, 12) with some of the new bit values derived for the extended bits.

FIG. 18 illustrates a table depicting a transposed version of the generator matrix from FIG. 17.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

The various concepts presented throughout this disclosure may be implemented across a broad variety of telecommunication systems, network architectures, and communication standards. While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

Figure 1:
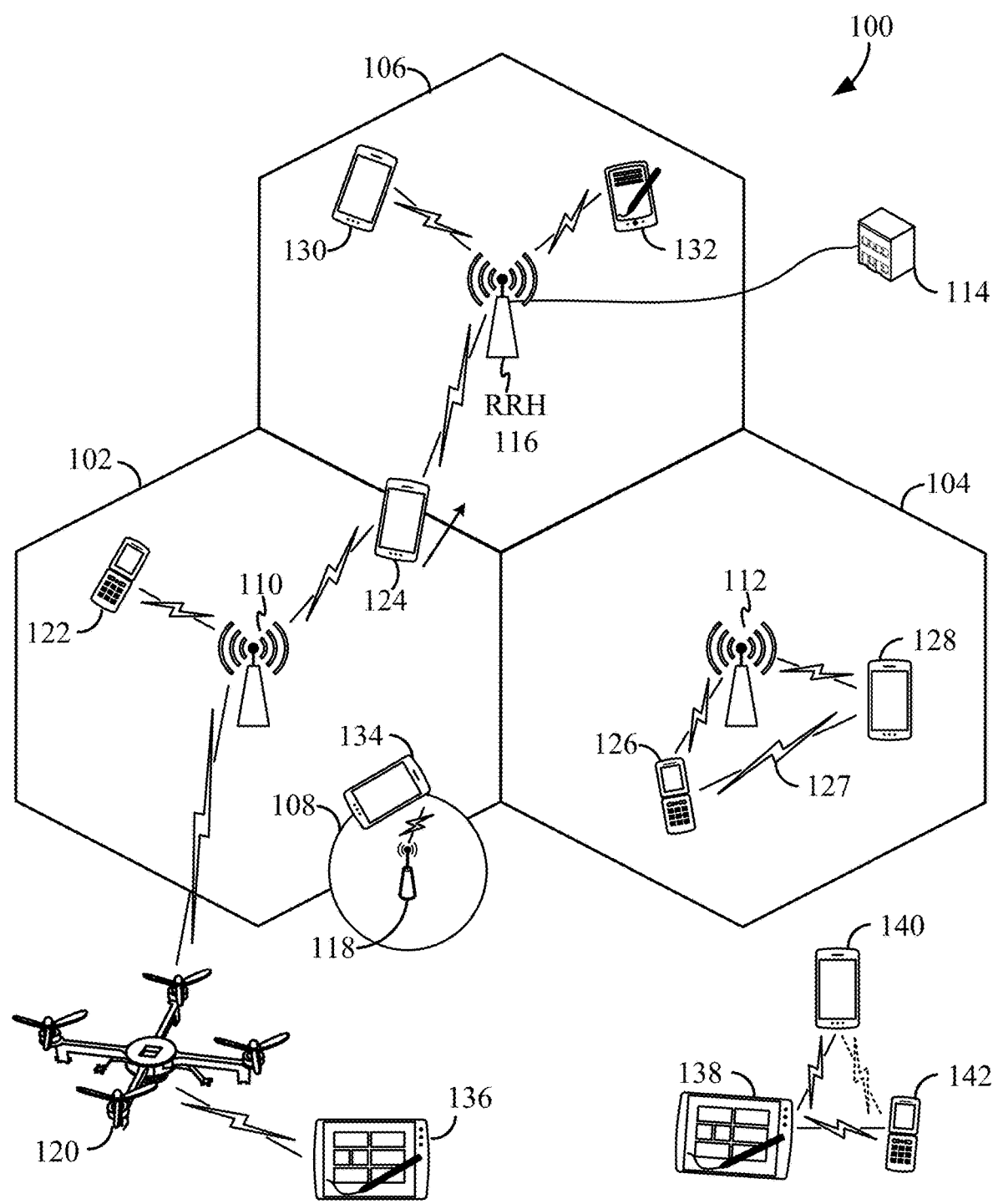
FIG. 1 is a block diagram of a network environment in which one or more aspects of the present disclosure may find application.

Referring now to FIG. 1, as an illustrative example without limitation, a block diagram of a network environment in which one or more aspects of the present disclosure may find application is provided. The access network 100 is adapted to facilitate wireless communication between two or more wireless communication devices.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors. A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, each cell is served by a respective base station (BS). Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

In FIG. 1, two base stations 110 and 112 are shown in cells 102 and 104, and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network, (not shown), and in some examples, the backhaul may provide interconnection between the respective base stations. The core network may be a part of a wireless communication system, and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, entertainment device, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the radio access network 100, the cells may include UEs that may be in communication with one or more sectors of each cell. For example, UEs 122 and 124 may be in communication with base station 110, UEs 126 and 128 may be in communication with base station 112, UEs 130 and 132 may be in communication with base station 114 by way of RRH 116, UE 134 may be in communication with base station 118, and UE 136 may be in communication with mobile base station 120. Here, each base station 110, 112, 114, 118, and 120 may be configured to provide an access point to a core network (not shown) for all the UEs in the respective cells. Transmissions from a base station (e.g., base station 110) to one or more UEs (e.g., UEs 122 and 124) may be referred to as downlink (DL) transmission, while transmissions from a UE (e.g., UE 122) to a base station may be referred to as uplink (UL) transmissions. In accordance with certain aspects of the present disclosure, the term downlink may refer to a point-to-multipoint transmission originating at a scheduling entity 202. Another way to describe this scheme may be to use the term broadcast channel multiplexing. In accordance with further aspects of the present disclosure, the term uplink may refer to a point-to-point transmission originating at a scheduled entity 204.

In some examples, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be transmitted in transmission time intervals (TTIs).

The air interface in the radio access network 100 may utilize one or more multiplexing and multiple access algorithms to enable simultaneous communication of the various devices. For example, 5G NR specifications provide multiple access for uplink (UL) or reverse link transmissions from UEs 122 and 124 to base station 110, and for multiplexing for downlink (DL) or forward link transmissions from base station 110 to one or more UEs 122 and 124, utilizing orthogonal frequency division multiplexing access (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
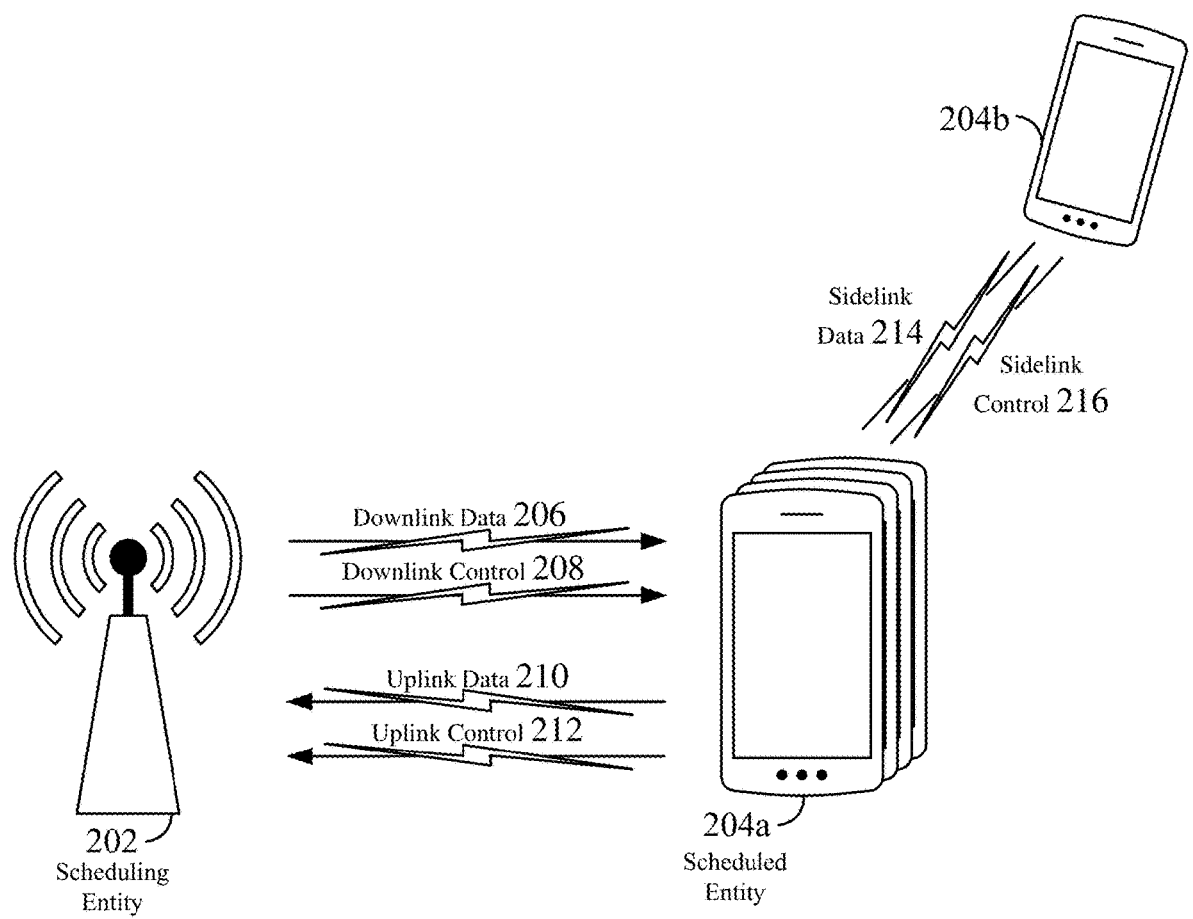
FIG. 2 is a block diagram conceptually illustrating an example of a scheduling entity communicating with one or more scheduled entities according to some embodiments.

Thus, in a wireless communication network with scheduled access to time-frequency resources and having a cellular configuration, a P2P configuration, or a mesh configuration, a scheduling entity and one or more scheduled entities may communicate utilizing the scheduled resources. Referring now to FIG. 2, a block diagram illustrates a scheduling entity 202 and a plurality of scheduled entities 204 (e.g., 204a and 204b). Here, the scheduling entity 202 may correspond to a base station 110, 112, 114, and/or 118. In additional examples, the scheduling entity 202 may correspond to a UE 138, the quadcopter 120, or any other suitable node in the radio access network 100. Similarly, in various examples, the scheduled entity 204 may correspond to the UE 122, 124, 126, 128, 130, 132, 134, 136, 138, 140, and 142, or any other suitable node in the radio access network 100.

As illustrated in FIG. 2, the scheduling entity 202 may broadcast traffic 206 to one or more scheduled entities 204 (the traffic may be referred to as downlink traffic). Broadly, the scheduling entity 202 is a node or device responsible for scheduling traffic in a wireless communication network, including the downlink transmissions and, in some examples, uplink traffic 210 from one or more scheduled entities to the scheduling entity 202. Broadly, the scheduled entity 204 is a node or device that receives control information, including but not limited to scheduling information (e.g., a grant), synchronization or timing information, or other control information from another entity in the wireless communication network such as the scheduling entity 202.

In some examples, scheduled entities such as a first scheduled entity 204a and a second scheduled entity 204b may utilize sidelink signals for direct D2D communication. Sidelink signals may include sidelink traffic 214 and sidelink control 216. Sidelink control information 216 may in some examples include a request signal, such as a request-to-send (RTS), a source transmit signal (STS), and/or a direction selection signal (DSS). The request signal may provide for a scheduled entity 204 to request a duration of time to keep a sidelink channel available for a sidelink signal. Sidelink control information 216 may further include a response signal, such as a clear-to-send (CTS) and/or a destination receive signal (DRS). The response signal may provide for the scheduled entity 204 to indicate the availability of the sidelink channel, e.g., for a requested duration of time. An exchange of request and response signals (e.g., handshake) may enable different scheduled entities performing sidelink communications to negotiate the availability of the sidelink channel prior to communication of the sidelink traffic information 214.

Figure 3:
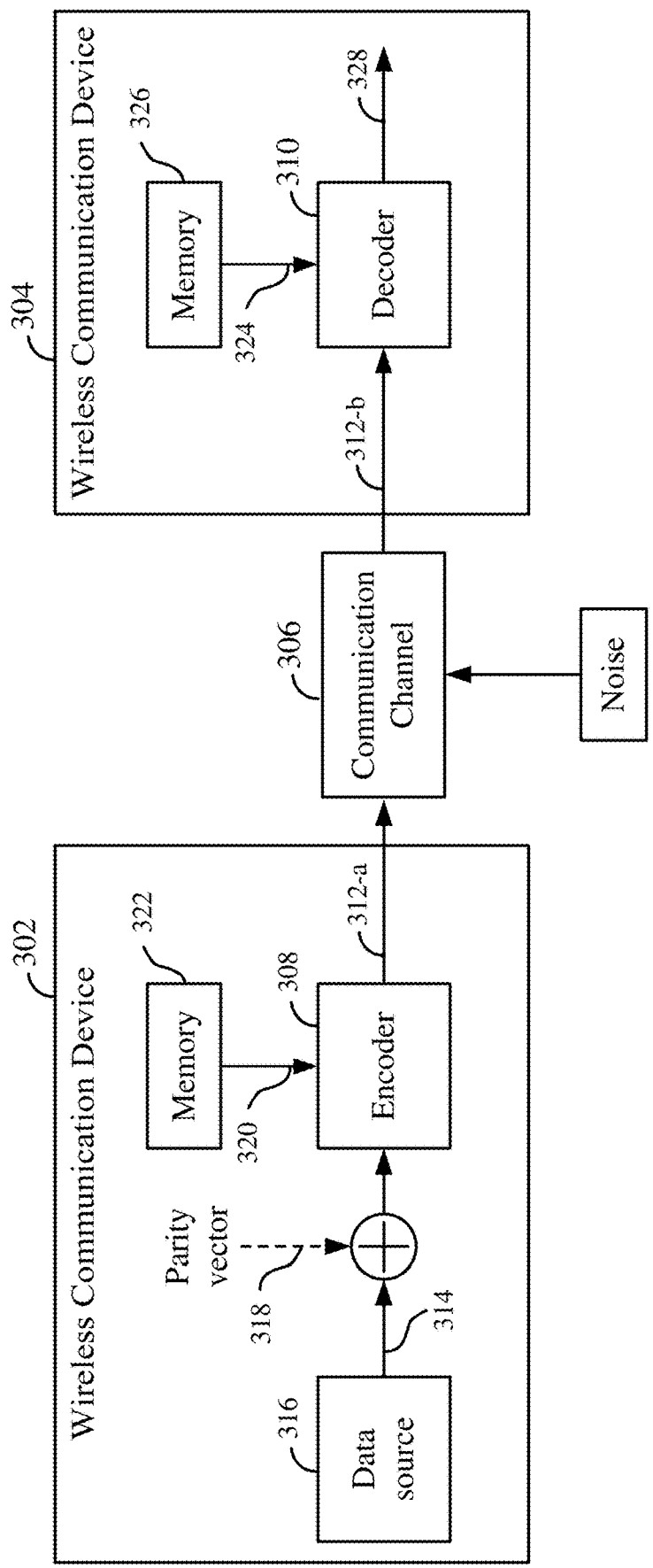
FIG. 3 is a schematic illustration of wireless communication between a first wireless communication device and a second wireless communication device.

FIG. 3 is a schematic illustration of wireless communication between a first wireless communication device 302 and a second wireless communication device 304. Each wireless communication device 302 and 304 may be an example of a user equipment (UE), a base station, or any other suitable apparatus or means for wireless communication. In the illustrated example, the first wireless communication device 302 can transmit a digital message over a communication channel 308 (e.g., a wireless channel) to the second wireless communication device 304. One issue in such a scheme that must be addressed to provide for reliable communication of the digital message is to take into account the noise that affects the communication channel 306. Accordingly, the first and second wireless communication devices 302, 304 may communicate codewords through the communication link or channel 306, where the codewords are encoded using a form of block coding or linear block coding.

Block codes, or error correcting codes are frequently used to provide reliable transmission of digital messages over such noisy channels. In a typical block code, an information message or sequence is split up into blocks, each block having a length of K bits. An encoder 308 at the first (transmitting) wireless communication device 302 then mathematically adds redundancy to the information message, resulting in codewords having a length of N, where N>K. Here, the coding rate R is the ratio between the message length and the block length: i.e., R=K/N. Exploitation of this redundancy in the encoded information message is the key to reliability of the message, enabling correction for any bit errors that may occur due to the noise. That is, a decoder 310 at the second (receiving) wireless communication device 304 can take advantage of the redundancy to reliably recover the information message even though bit errors may occur, in part, due to the addition of noise to the channel.

In some cases, the first (transmitting) wireless communication device 302 may generate a codeword 312-*a* based on a bit stream, which is referred to herein as an information vector 314. The first wireless communication device 302 may include a data source 316 that generates the information vector 314. In some examples, the data source 316 may include higher layers of a radio access technology or other circuitry of the first wireless communication device 302. As used herein, an information vector may refer to a collection of bits or symbols to be transmitted over a network to another entity, where the bits or symbols may include information for a particular application. For example, the information vector 314 may be a 1×Q array of bits or symbols. In some examples, the information vector 314 may include control information.

Upon identifying the information vector 314, the first wireless communication device 302 may optionally incorporate a parity vector 318 with the information vector 314. The parity vector 318 may be configured as a set of information used to detect or correct errors that occur in the information vector 314 during transmission. The parity vector 318 may be generated based on the information vector 314. As used herein, the parity vector 318 may refer to a collection of bits or symbols to be transmitted over a network to another entity, where the bits or symbols may include information for detecting or correcting errors in a coded information vector. For example, the parity vector 318 may be a 1×R array of bits or symbols.

When a parity vector 318 is used, the parity vector 318 may be combined with the information vector 314. For example, the parity vector 318 may be appended to the end of the information vector 314. Such a resulting vector may be an array having a size of 1×K, where K=Q+R. In other examples, the parity vector 318 may be interleaved with the information vector 314. In yet other examples, the parity vector 318 may be inserted into any location of the information vector 314. In some examples, the parity vector 318 is not added to the information vector 314. In some cases, the term information vector may refer to the vector that includes both the information vector 314 and the parity vector 318.

The first wireless communication device 302 may encode the resulting information vector using an encoder 308 to obtain the codeword 312-*a*. The encoder 308 may receive both the information vector (e.g., the information vector 314 and optionally the parity vector 318) and a generator matrix 320. The generator matrix 320 may be stored in a memory 322 of the first wireless communication device 302, in some examples. The generator matrix 320 may be an array of bits or symbols having a size of K×N. The generator matrix 320 may be configured to generate a 1×N codeword 312-*a* from a 1×K information vector. In some examples, the information vector may be multiplied by the generator matrix 320 to obtain the codeword 312-*a*. Features of the generator matrix 320 are described with greater detail below. In some examples, the codeword 312*a* may be a vector of bits or symbols having a size of 1×N. A parity check matrix 324 that corresponds to the generator matrix 320 may be used by the second (receiving) wireless communication device 304 to decode the received codeword 312-*b*. The received codeword 312*b* may be an example of the transmitted codeword 312*a* multiplied with the communication channel 306 used for transmission. In some examples, the received codeword 312*b* may include one or more errors that were not part of the transmitted codeword 312-*a*.

The second wireless communication device 304 may decode the codeword 312*b* using the decoder 310. The decoder 310 may generate or identify a parity check matrix 324. The parity check matrix 324 may be configured to decode the codeword 312*b* encoded by its corresponding generator matrix 320. The parity check matrix 324 may be stored in a memory 326 of the second wireless communication device 304, in some examples. The parity check matrix 324 may be an array of bits or symbols having a size of N×K. The parity check matrix 324 may be configured to generate a 1×K syndrome vector 328 from the 1×N codeword 312-*b*. The syndrome vector 328 may represent the information vector 314 (e.g., when correctly decoded according to the parity check matrix 324). In some examples, demapped symbols of the codeword 312-*b* may be processed using the parity check matrix 324 to obtain the syndrome vector 328. In some examples, log-likelihood ratios (LLRs) representing the demapped symbols may be iteratively or recursively processed to determine hard bits or symbols for the syndrome vector 328. Features of the parity check matrix 324 are described in greater detail below. After obtaining the syndrome vector 328, the second wireless communication device 304 may perform any number of operations to obtain the information vector 314 from the syndrome vector 328 (e.g., determining if an error check function of a parity vector of the syndrome vector passes, etc.).

The generator matrix 320 and the parity check matrix 324 may include a number of different features to provide error detection and/or error correction. The matrices 320, 324 may be one of a number of different types of error correcting block codes generally known to those of ordinary skill in the art. For example, some existing wireless communication networks, such as 3GPP LTE networks, utilize block codes such as Reed-Muller code design for error correction in transmissions with block lengths supporting codewords N=32, N=24, and/or N=20. For instance, Reed-Muller (RM) coding may be used for PUCCH transmissions utilizing a punctured version of (32, 0), which is the subcode of $2^{nd}$ order RM code with N=32. Such punctured coding supports N=20 and N=24. However, RM coding is not optimized for block lengths of N=20 or N=24. According to aspects of the present disclosure, a shortened Golay coding is employed for block lengths of N=20, N=24, and N=32, where the message length may be between 2 and 12 (e.g., K=2 through K=12).

Figure 4:
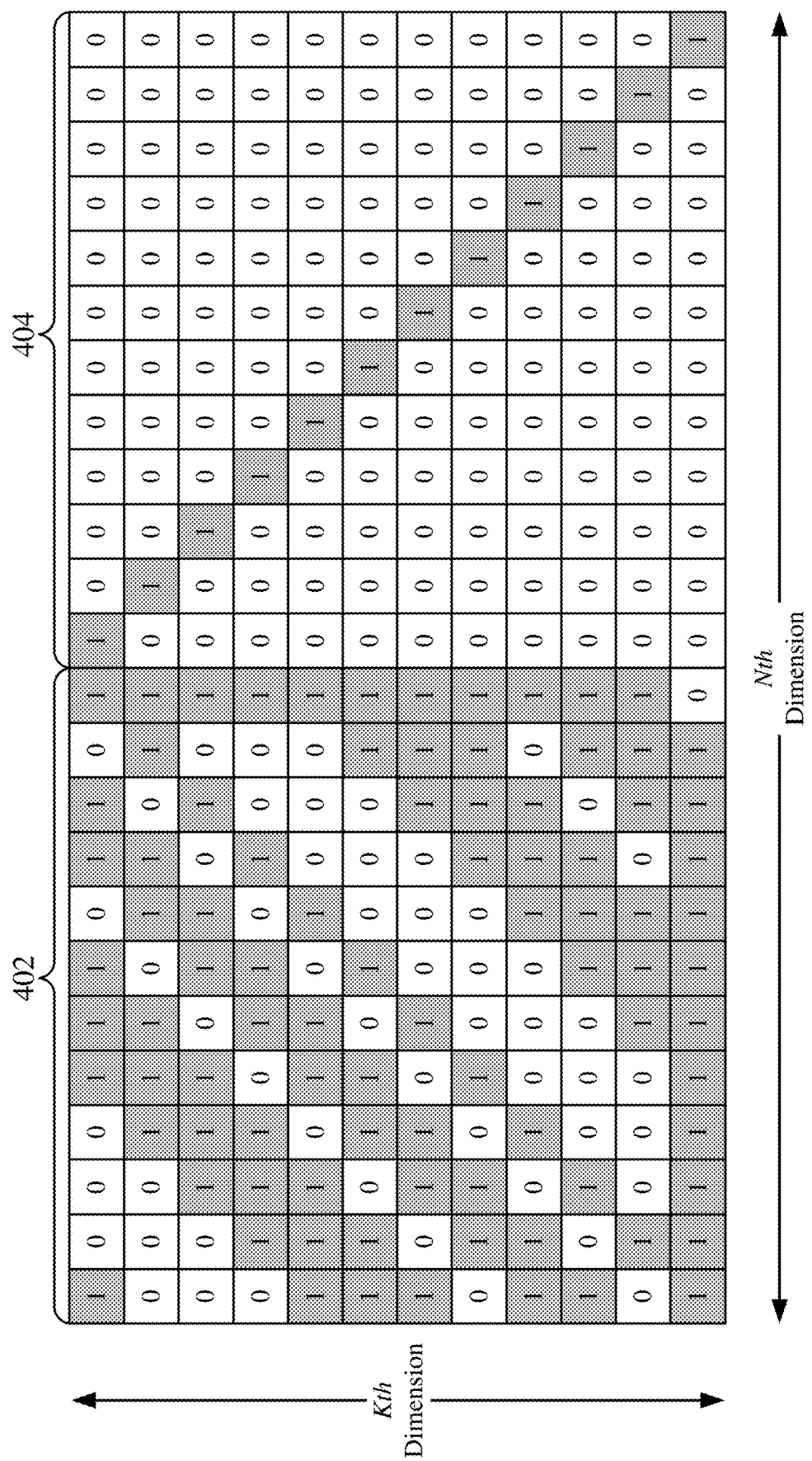
FIG. 4 is schematic view of a typical (24, 12) Golay code generator matrix.

Conventional Golay code encodes 12 bits of data in a 24-bit codeword in such a way that any 3-bit errors can be corrected or any 7-bit errors can be detected. In standard code notation the codes have parameters [24, 12, 8], corresponding to the length of the codewords, the dimension of the code, and the minimum Hamming distance between two codewords, respectively. FIG. 4 is a typical 24×12 (or (24, 12)) Golay code generator matrix. In the matrix shown, the left 12×12 section 402 represents the parity check bits (e.g., error detection/correction portion) and the right 12×12 section 404 represents the systematic bits (e.g., identity portion).

Figure 5:
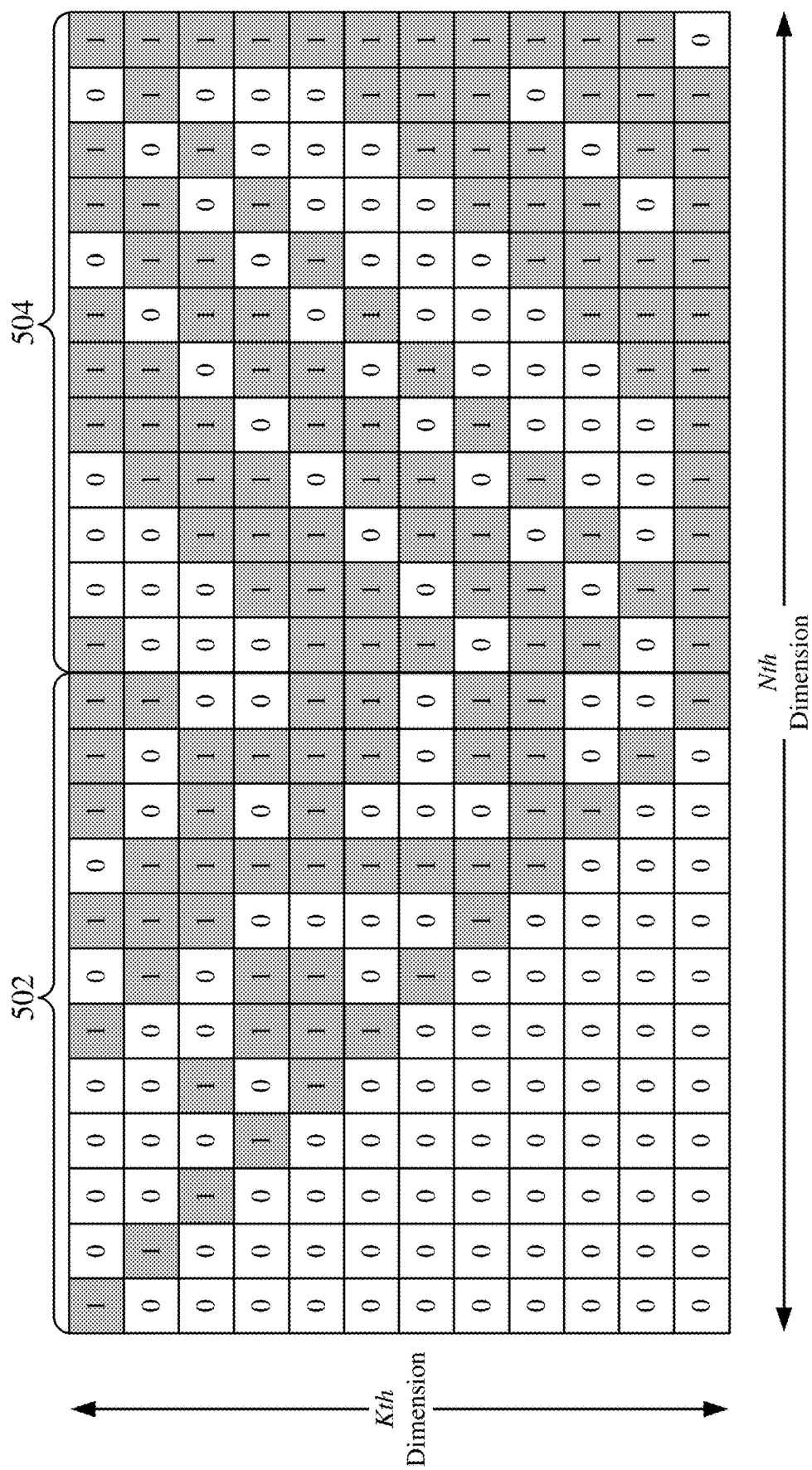
FIG. 5 is an example of a Golay code generator matrix derived from a shortened portion of the generator matrix from FIG. 4.

According to an aspect of the present disclosure, a unique generator matrix is employed for Golay coding communications for N=20, N=24, and N=32, where the message length (e.g., the length of the information vector) is between 2 and 12 (e.g., K=2 through K=12). The generator matrix can be derived from a shortened systematic Golay coding generator matrix based on the generator matrix depicted in FIG. 4, as described in more detail below. An example of a particular generator matrix is depicted in FIG. 5, which is derived from a shortened generator matrix from FIG. 4, where K=4. In this example, the parity check bits 504 remain the same as the parity check bits 402 in FIG. 4, but in FIG. 5, are moved behind the systematic bits 502. This generator matrix in FIG. 5 can be transposed in the form shown in FIG. 6. An encoder can be configured to encode data bits utilizing the generator matrix in FIG. 6 with the equation A for implementations where N=24 and K is between 2 and 12, and with the equation B for implementations where N=20 and K is between 2 and 12.

$$N = 24 \text{ or } 32, K = 2 \sim 12, i = 0 \sim N - 1: \quad\quad A$$
$$b_i = \begin{cases} o_i & (i < K) \\ \sum_{n=0}^{K-1} (o_n \cdot M_{i,n}) \bmod 2 & (i \geq K) \end{cases}$$

$$N = 20, K = 2 \sim 12, i = 0 \sim N - 1: \quad\quad B$$
$$b_i = \begin{cases} o_i & (i < K) \\ \sum_{n=0}^{K-1} (o_n \cdot M_{i,n}) \bmod 2 & \left(i \geq Ki' = \begin{cases} i, i < 8 \\ i+4, i \geq 8 \end{cases}\right) \end{cases}$$

In the equations A and B, the variables N and K represent the same variables as noted above; specifically, N is the number of encoded bits and K is the number of information bits (e.g., length of the information vector 314). The variable b represents how each of the encoded bits are formulated, such that $b_i$ is the output bit or symbol at index i. The variable $o_n$ represents the current input bit or symbol for the index n=0 through n=K−1. As shown in the equations, for each instance where i is less than K, the output bit or symbol $b_i$ equals the input bit or symbol $o_n$, and for each instance where i is greater than or equal to K, the sum is calculated to obtain the output bit value $b_i$.

Figure 7:
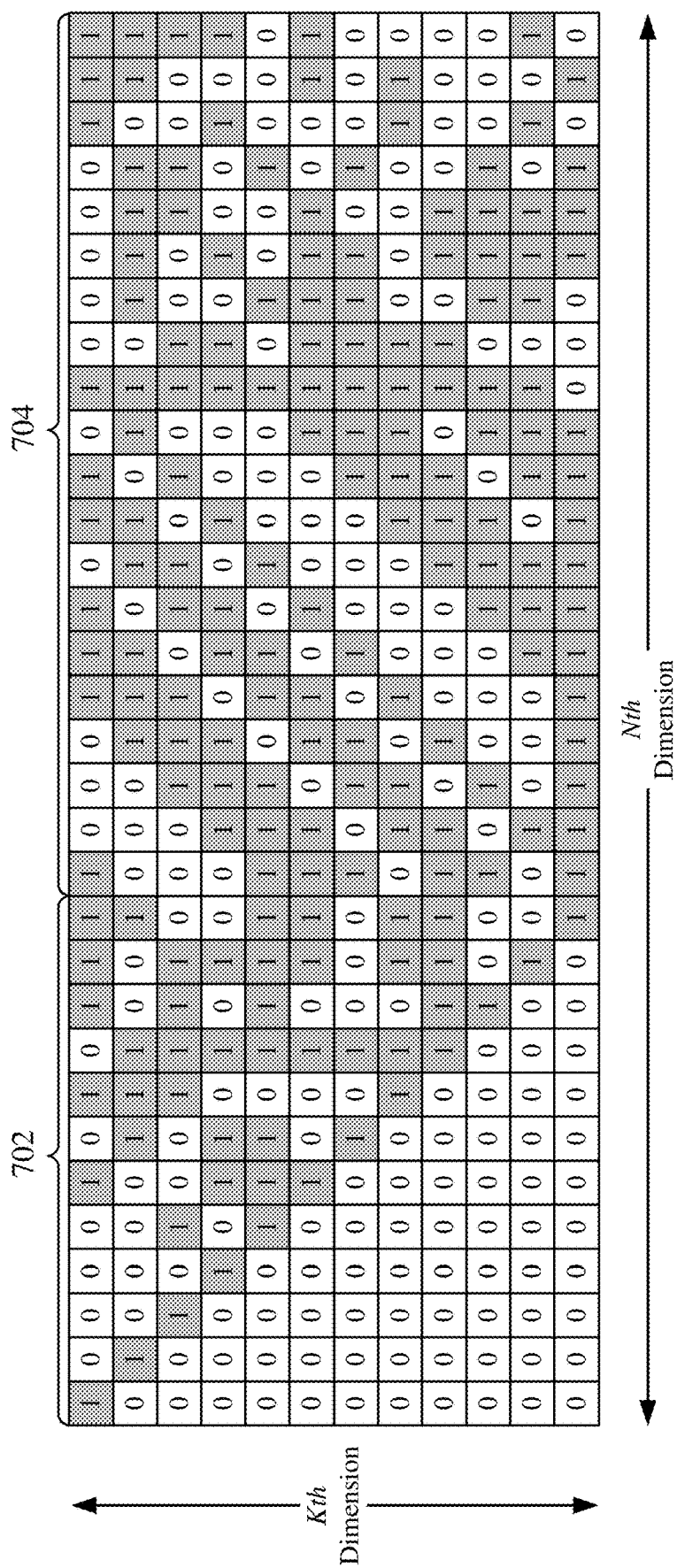
FIG. 7 is a generator matrix obtained by extending the generator matrix from FIG. 5 to support N=32.

A generator matrix derived from the generator matrix in FIG. 4 can be further extended to support N=32 and K between 2 and 12 (e.g., K=2 through K=12). FIG. 7 illustrates a generator matrix where a generator matrix derived from K=2 is extended to support N=32. Where N=32 or N=24, the encoder utilizes the equation A above. Further, when N=20, the encoder can utilize the equation B above.

Figure 8:
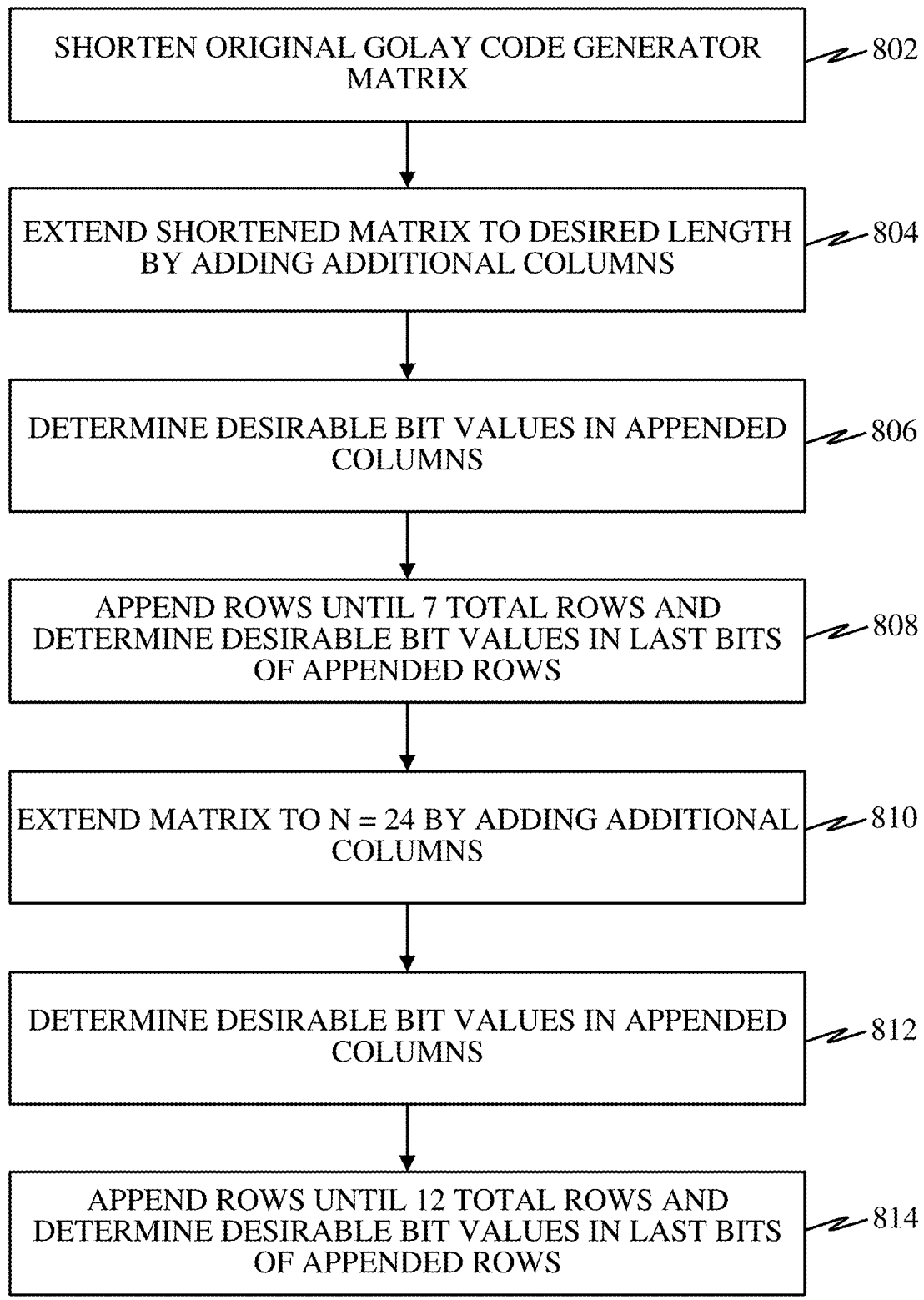
FIG. 8 is a flow diagram depicting a process for obtaining a generator matrix from a shortened generator matrix for Golay coding, according to at least one example.
Figure 9:
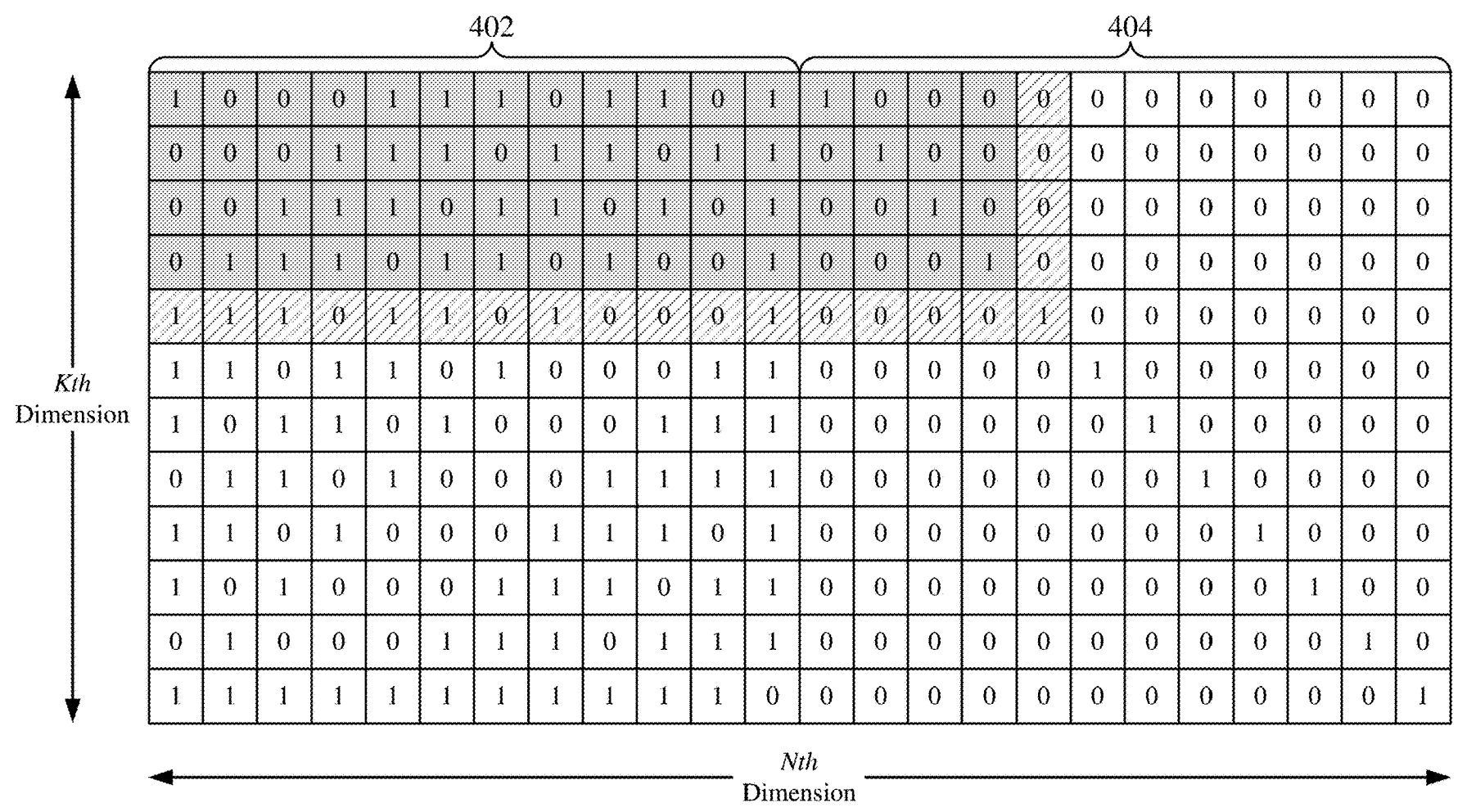

The generator matrix in FIG. 5 and the generator matrix in FIG. 7 are derived from a portion of the generator matrix of FIG. 4, where K=4, and may be examples of the generator matrix 320 or the parity check matrix 324 described with reference to FIG. 2. Aspects of the present disclosure relate to deriving a generator matrix for Golay coding from a shortened matrix. FIG. 8 is a flow diagram of a method for determining a generator matrix according to the present disclosure. According to at least one example, the various steps may be carried out by a processing circuit, such as the processing circuit 1906 described below with reference to FIG. 19. At 802, the original Golay code generator matrix is shortened. For example, a systematic Golay code can be shortened to get the (N, K) systematic bits, where N=24−m and K=12−m. In one specific example, K may be 4, meaning that m is 8 when K=12−m. With m=8, N is 16. The shortened generator matrix is therefore a (16, 4) generator matrix (e.g., 16 columns by 4 rows) shortened from the original generator matrix in FIG. 4. That is, as shown in FIG. 9, the generator matrix of FIG. 4 is shortened to a (16, 4) matrix including the shaded bits within the original (24, 12) generator matrix of FIG. 4. If K were 5, then the shortened matrix would be a (17, 5) matrix, which would include the bits that are shown in FIG. 9 with a hatch pattern. Options of shortened matrices include those with values of K between 2 and 11. Thus, possible shortened matrices include (14, 2), (15, 3), (16, 4), (17, 5), (18, 6), (19, 7), (20, 8), (21, 9), (22, 10), and (23, 11).

Figure 10:
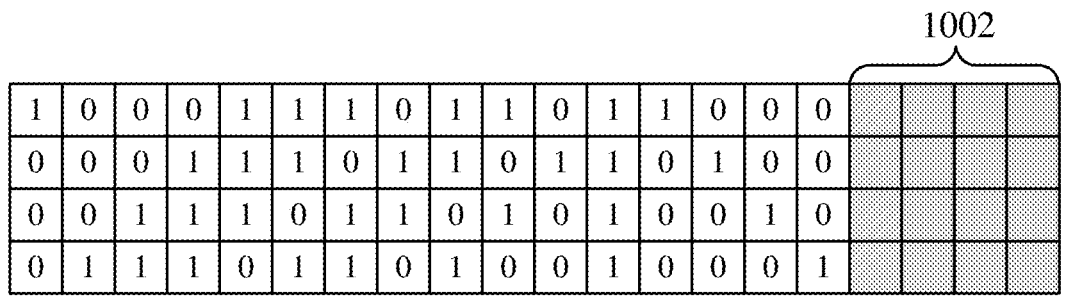
FIG. 10 depicts the shortened generator matrix of FIG. 9 extended out to (20, 4).

After the original (24, 12) generator matrix is shortened, columns are appended to the systematic bits to obtain a desired codeword length at 804. For example, FIG. 10 shows an example of a (16, 4) shortened matrix with 4 columns 1002 appended to the systematic bits to form a (20, 4) matrix, as shown by the shaded bits. At 806 in FIG. 8, a search is performed for the appended columns 1002 to identify values for each of the appended bits that are desired for one or more particular scenarios. That is, each possible combination of values for the appended bits is tested and compared to each other to identify one or more desirable combinations of values for the appended bits.

Criteria for identifying desirable combinations at step 806 can include Hamming distance and the weight distribution in at least one implementation. In other scenarios, other parameters may be utilized. In an example utilizing Hamming distance and weight distribution, a first combination of values for the systematic bits in the appended columns (e.g., a first test matrix) may be considered and a Hamming distance can be calculated. A second combination of values (e.g., a second test matrix) is then considered and the Hamming distance for the second test matrix is calculated. If the Hamming distance for the first test matrix is greater than the Hamming distance for the second test matrix, then the second test matrix is dropped from consideration, and the next test matrix is tested. On the other hand, if the Hamming distance for the second test matrix is greater than the first test matrix, then the second test matrix is identified as the best generator matrix, and the first test matrix is dropped from consideration, and the next test matrix is tested. If the Hamming distance for the first test matrix and the second test matrix is the same, then the weight distribution of codewords is considered to determine if one test matrix is preferred over the other test matrix.

The consideration of weight distribution refers to a desire to minimize low weight codewords. Generally, weight of a codeword equates to how many quantities of interest a codeword includes. After encoding, the total codeword can be described as $c_0, c_1, \ldots c_{2^k-1}$, where k is the information bit number, and where each codeword has a length of N. The first codeword $c_0$ is always 0 in each of its elements. For $c_1$ through $c_{2^k-1}$, a count is made of how many '1s' are in each codeword to determine the weight of the codeword. For example, a codeword with 10 '1s' in the codeword has a weight of 10. The weight distribution is regarded as the number of codewords having a weight equal to 'M'.

Suppose the weight distribution of the best codeword generated by the first test matrix is ($X_n$, n), where n is the weight and $X_n$ is the corresponding count of how many codewords have such a weight. The weight distribution ($X_n$, n) for the first test matrix is compared to the weight distribution ($Y_n$, n) for the second test matrix. A test for n greater than 0 is done in consecutive order; if $Y_n$ is less than $X_n$, then the second test matrix will replace the first test matrix as the preferred generator matrix. On the other hand, if $Y_n$ is greater than $X_n$, then the first test matrix is considered the preferred generator matrix. The loop continues to the next n if $Y_n$ is equal to $X_n$. If $Y_n$ is equal to $X_n$ for all n, then the first test matrix and the second test matrix are considered equally as good generator matrices, and both will be retained as candidates for the generator matrix.

Because there are 16 total bits to be determined, there will be $2^{16}$ possible combinations to be tested. In other words, there will be 65,536 test matrices tested to determine the candidate generator matrices for the (20, 4) matrix.

Figure 11:
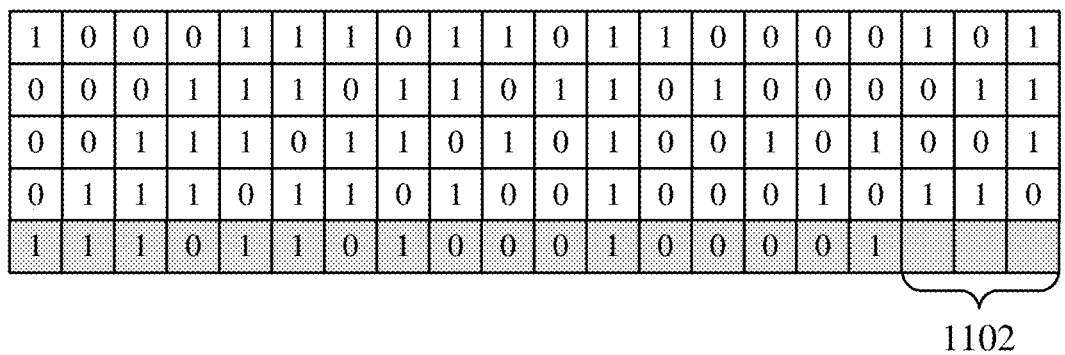
FIG. 11 shows the (20, 4) generator matrix of FIG. 10 with new bit values derived for the extended columns.

After preferred candidate bit value combinations are determined for the (20, 4) matrix, a candidate is selected and rows are appended to the matrix one at a time until there are a total of 7 rows, and desired bit values are determined for each appended row at step 808 in FIG. 8. For example, a fifth row is appended, as shown in FIG. 11. The parity bit values for each appended row can be retained from the original generator matrix. In the fifth row, the bit values for the last three systematic bits are determined using three of the four columns that were previously appended. That is, three of the four columns 1002 in FIG. 10 will be utilized in determining the values for the systematic bits 1102 in the fifth row. Accordingly, all possible combinations for the three bits 1102 are tested with all the possible combinations of three of the four columns 1002 to determine which values for bits 1102 in row 5 have the best Hamming distance and weight distribution.

Figure 12:
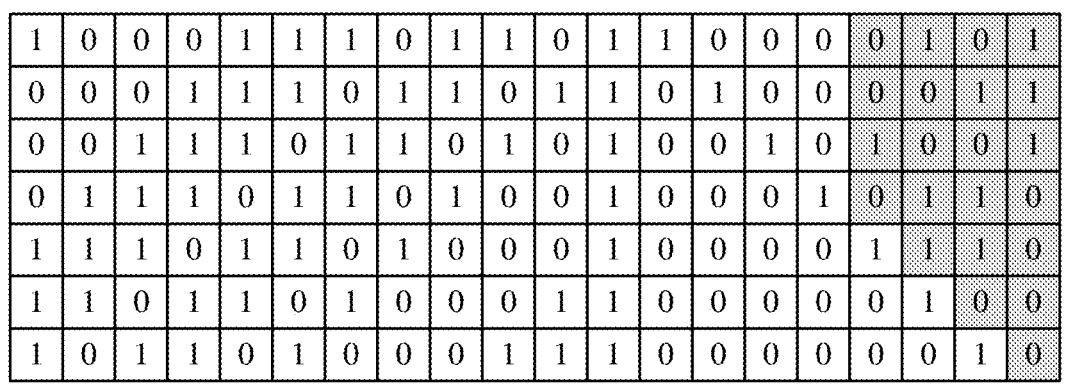
FIG. 12 shows the (20, 4) generator matrix of FIG. 11 extended to (20, 7) with new bit values derived for extended bits.

After the possible values for the three bits in the fifth row are determined, a set is selected and the next row, the sixth row, is appended to the matrix. For the sixth row, the last two bit values are determined in the same way the three bits 1102 were determined for the fifth row. Similarly, a seventh row is appended and the value for the last bit for the seventh row is determined in a similar manner that the three bits 1102 were selected. The result is at least one (20, 7) matrix like the example shown in FIG. 12, where the shaded systematic bits have all been determined based on the metric providing the best Hamming distance and weight distribution.

Figures 13, 14:
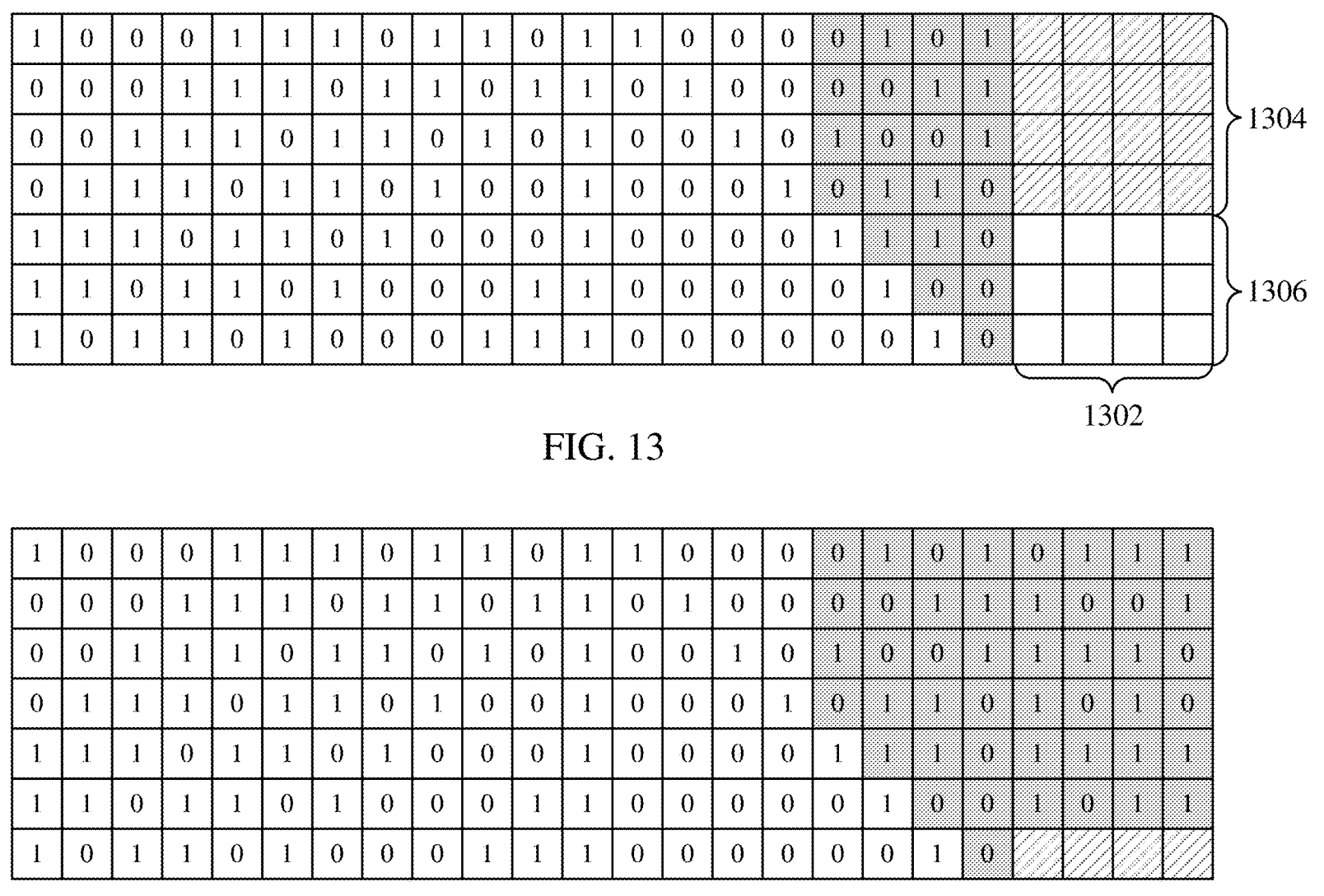

At 810 in FIG. 8, the (20, 7) matrix is subsequently extended to a (24, 7) matrix by appending four additional columns 1302, as shown in FIG. 13. At 812 in FIG. 8, bit values are determined for the appended columns. Initially, bit values may be determined for the first four rows 1304 of the appended columns 1302, which are indicated by the hatched pattern in FIG. 13. These 16 bits can be determined in a manner similar to the way the bits 1002 were determined, as described above with reference to FIG. 10 and with reference to step 806 in FIG. 8. In general, all possible combinations may be considered and compared to identify the combinations with the best Hamming distance and weight distribution.

After the values for the 16 bits that are shown in FIG. 13 with the hatched shading are determined and selected, the remaining bits for the fifth through the seventh rows indicated element number 1306 are determined on a row by row basis. For example, the values for the last four bits may be determined for the fifth row, then for the sixth row, and then, as shown by the hatched shading in FIG. 14, the values for the last four bits in the seventh row are determined. As stated previously, the bit values are selected based on those bits that will provide the best Hamming distance and weight distribution.

After candidate bit value combinations are determined for the (24, 7) matrix, a candidate is selected and rows are appended to the matrix one at a time until a total of 12 rows, and desirable bit values are determined for each appended row at step 814 in FIG. 8. The new rows (e.g., the eighth through the eleventh rows) can be appended, and the bit values determined in a manner similar to that described above with reference to step 806 in FIG. 8 and with reference to FIG. 10. For example, an eighth row is appended with the parity bit values retained from the original generator matrix. In the eighth row, the bit values for the last four bits are determined using three of the four columns that were appended previously. That is, three of the four appended columns may be utilized in determining the values for the bits in the eighth row. Accordingly, all possible combinations for the four bits in the eighth row may be tested with all the possible combinations of three of the four columns to determine which values for the bits in the eighth row have the best Hamming distance and weight distribution.

After the possible values for the four bits in the eighth row are determined, a set is selected and the next row, the ninth row, is appended to the matrix. For the ninth row, the last three bit values are determined in the same way the four bits were determined for the eighth row. Similarly, a tenth row is appended and the value for the last two bits for the tenth row are determined in a similar manner that the four bits in the eighth row were selected. Additionally, an eleventh row is appended and the value for the last bit for the eleventh row is determined in a similar manner Finally, the twelfth row from the original generator matrix is appended as the twelfth row in the newly derived generator matrix. The result is a (24, 12) matrix. To complete the matrix derivation, the systematic bits can be moved above the parity check bits to arrive at a generator matrix like the example shown in FIG. 5. A total of 96 different generator matrices may be obtained, with each matrix providing equal Hamming distance and weight distributions. FIG. 5 is an example of just one generator matrix that may be derived from the above described process.

Figure 15:
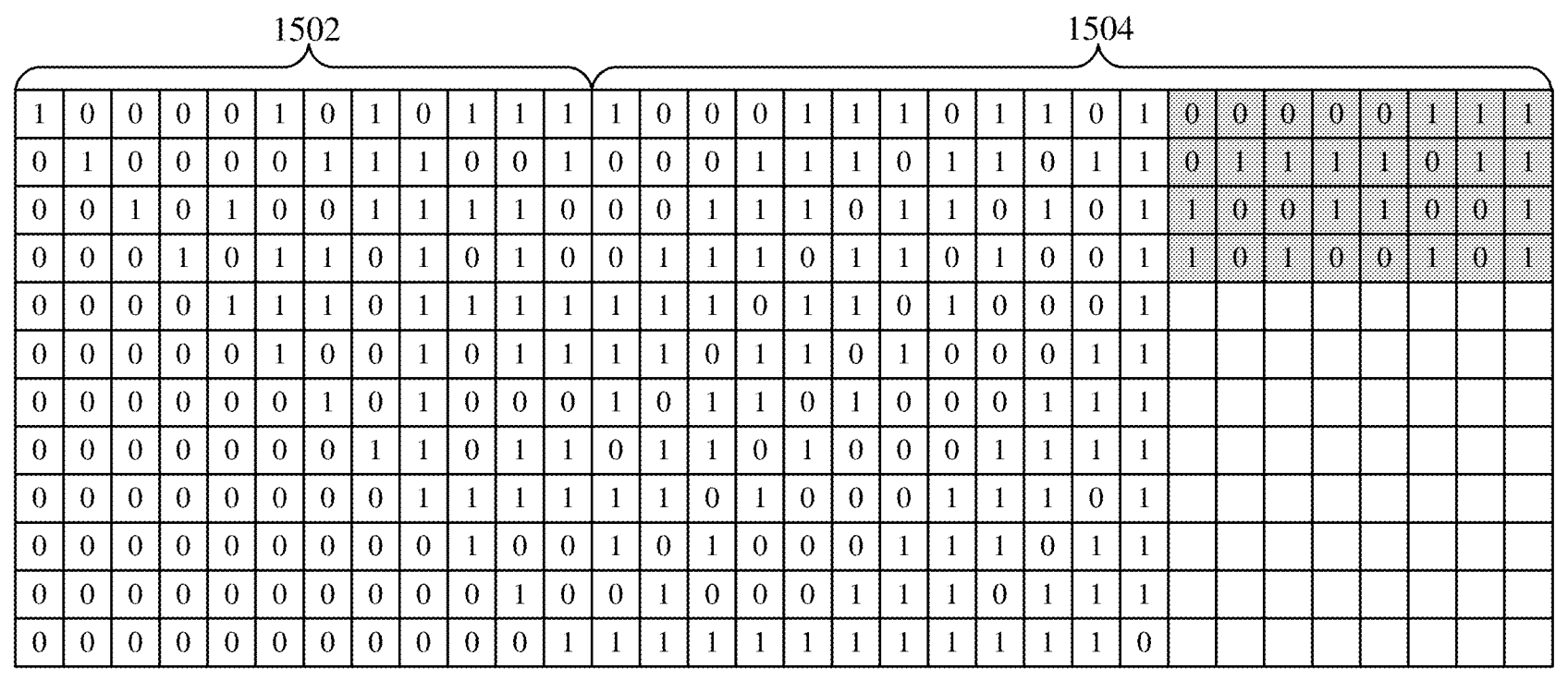

The above process describes an exemplary method for obtaining a Golay coding generator matrix with N equal to 24 and K less than 12 from a shortened generator matrix. The resulting generator matrix can further be extended to support N equal to 32 and K less than or equal to 12. The values for the bits in the appended 8 columns can be determined in a sequential manner similar to that described above. For example, utilizing the (24, 12) generator matrix that was obtained above, such as that shown in FIG. 5, 8 columns can be appended to the parity bits. Referring to FIG. 15, the systematic bits 1502 are positioned in front of the parity bits 1504 to illustrate appending the 8 columns and obtaining the bit values for the 8 appended columns. Initially, the bit values for the first four rows of the appended 8 columns are determined. As shown in FIG. 15, the bit values for the shaded bits of the (32, 4) matrix may be determined by testing each possible combination, and comparing the possible combinations to determine the combinations with the best Hamming distance and weight distributions, as described above with reference to step 806 in FIG. 8 and with reference to FIG. 10.

After a combination is selected, each remaining row may be determined on a row by row basis. For example, the last 8 bits are tested for the fifth row to determine which combinations provide the best Hamming distance and weight distributions. A combination of bit values is selected and the sixth row is next considered. This continues row by row until the entire matrix is filled. The example in FIG. 7 is an example of a (32, 12) generator matrix obtained by the above described process. It has been discovered that there are 48 possible (32, 12) generator matrices with equal Hamming distance and weight distributions that could also be selected by the described process.

After the (32, 12) generator matrix is obtained by the forgoing process, column 3 of the systematic bits can be modified with a '1' in the first row and column 4 can be modified with '1' in each of rows 1 through 3. This modification represents the (32, 12) generator matrix adapted to support K=2 and K=3 in addition to K=4 through K=12.

Referring back to FIG. 3, in some systematic block codes, the generator matrix 320 and the parity check matrix 324 may be related. For example, the generator matrix 320 may be expressed as G=[$I_k$↑P], where I is an identity matrix of size K and P is an error detection and/or error correction matrix. In such examples, the parity check matrix 324 may be expressed as H=[$-P^T|I_{n-k}$], where P is a transposed version of P in the generator matrix 320 and I is an identity matrix of size n−k.

Additional aspects of the present disclosure relate to obtaining a non-systematic block code from a systematic block code. Such non-systematic block codes may further improve the performance of data transfer using the communication channel 306.

In some cases, the receiving wireless communication device 304 may already know at least some of the systematic bits or symbols being transmitted in a codeword 312-*a*. For example, some bits of an information vector may be unused in certain situations, and set to a known value. In such cases, these known bits or symbols are effectively shortened (the codeword has deterministic corresponding bits which do not provide any additional coded information for the unknown bits). As such, the effective codeword length is reduced and system performance may be degraded.

The wireless communication device 304 may be aware of known bits or symbols in a variety of applications. For example, in LTE carrier-aggregation, the wireless communication device 304 may be aware of some of the information being transmitted as part of a hybrid automatic repeat request (HARQ) acknowledgement (ACK) or HARQ negative acknowledgement (NACK). Each ACK/NACK may correspond to one transport block per subcarrier. For non-scheduled sub-carriers, the ACK/NACK may not be transmitted and may appear to the transmitting wireless communication device 302 like a known bit or symbol.

Figure 16:
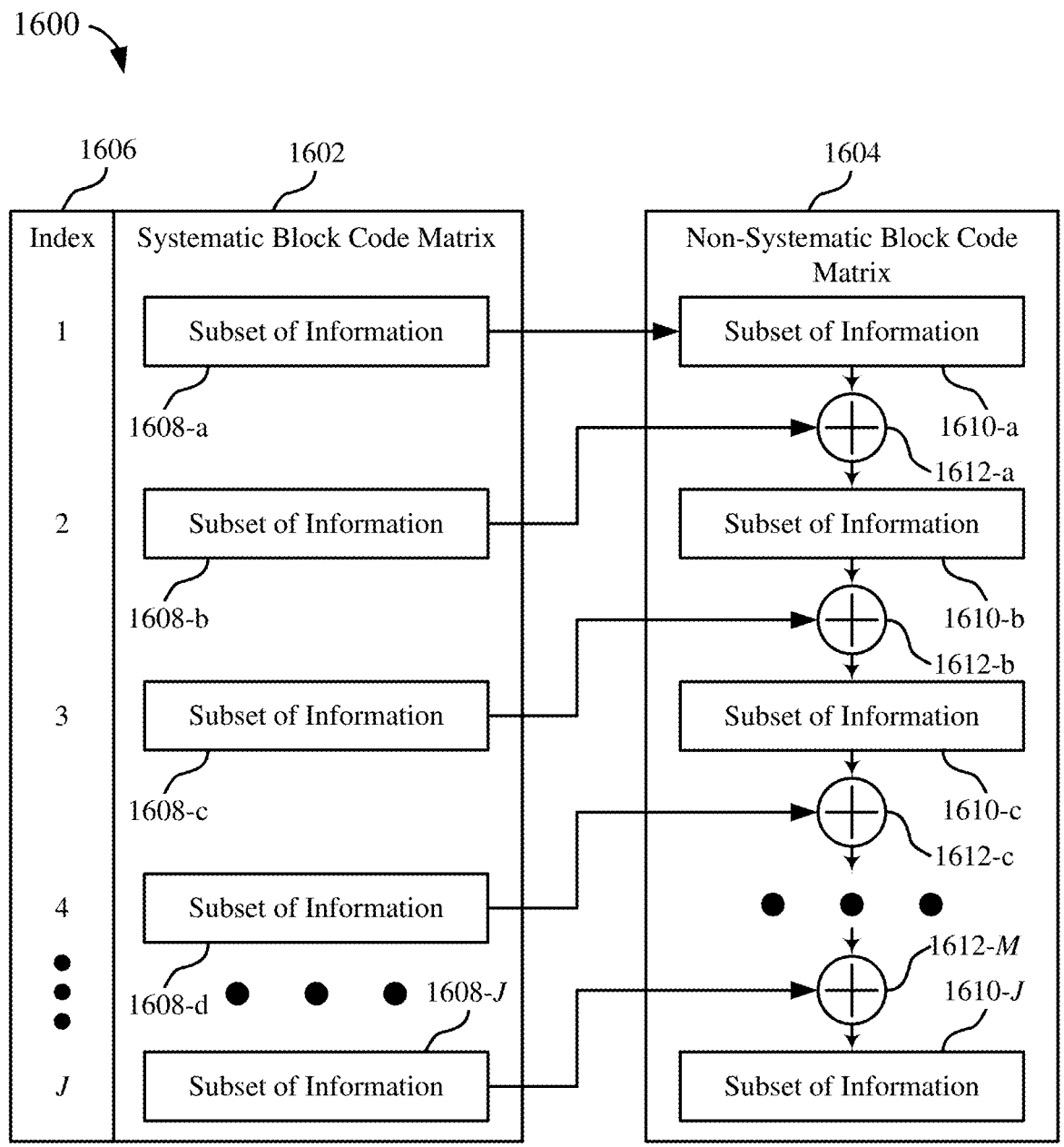
FIG. 16 is a block diagram depicting generation of a non-systematic block code from a systematic block code according to at least one example of the present disclosure.

According to described aspects, a non-systematic block code based on a systematic block code may provide the benefits of a Golay-based block code without the system performance impact of known bits in the information vector. FIG. 16 illustrates examples of block code structures 1600 that support encoding and decoding using non-systematic block codes in accordance with various aspects of the present disclosure. The block code structures 1600 may include a systematic block code matrix 1602 and a non-systematic block code matrix 1604 obtained based on the systematic block code matrix 1602. FIG. 16 includes an index 1606 to provide common references between the two matrices 1602, 1604. The matrices 1602, 1604 may be examples of the generator matrix 320 or the parity check matrix 324 described with reference to FIG. 3. In some examples, the matrices 1602, 1604 may be examples of Golay-based matrices.

The block code structures 1600 illustrate a process for generating the non-systematic block code matrix 1604 based on the systematic block code matrix 1602. In some examples, the process illustrated by the block code structures 1600 may be referred to as a transform of the systematic block code matrix 1602 to the non-systematic block code matrix 1604. The process or transform may be applied to systematic generator matrices or systematic parity check matrices.

The systematic block code matrix 1602 may be partitioned into a plurality of subsets of information 1608 along a first dimension. The subsets of information 1608 may be associated with an index value of the index 1606. The subsets of information 1608 may be used to obtain subsets of information 1610 for the non-systematic block code matrix 1604. In some examples, the subsets of information 1608 may be vectors of bits or symbols. In some instances, the vector may be an array of size 1×X, where X is one of the dimensionalities of the systematic block code matrix 1602. In some examples, the subsets of information 1608 may represent rows of the systematic block code matrix 1602.

A first subset of information 1610-*a* of the non-systematic block code matrix 1604 may be obtained based on a first subset of information 1608-*a* of the systematic block code matrix 1602. In some examples, the first subset of information (e.g., first row) 1610-*a* is a replica of the first subset of information (e.g., first row) 1608-*a*. The index value for the subset of information 1610-*a* may be the same as the index value for the subset of information 1608-*a*. The subset of information 1610 may be an example of the subset of information 1608, and, as such, may include similar features or characteristics.

The second subset of information 1610-*b* of the non-systematic block code matrix 1604 may be based on the second subset of information 1608-*b* of the systematic block code matrix 1602 and the first subset of information 1610-*a* of the non-systematic block code matrix 1604. At block 1612-*a*, the first subset of information 1610-*a* (e.g., the first row) may be added to the second subset of information 1608-*b* (e.g., the second row) to obtain the second subset of information 1610-*b*. Said another way, to obtain a subset of information 1610 of the non-systematic block code matrix 1604 having a particular index value, a subset of information 1608 of the systematic block code matrix 1602 having the same particular index value may be combined with a subset of information of the non-systematic block code matrix 1604 having a preceding index value. In some examples, the operation represented by the block 1612*a* may be a vector addition (e.g., binary addition of the respective row with the preceding row), bit-wise OR operation, or a bit-wise XOR operation.

Each of the subsets of information 16104 (besides the first subset of information 1610-*a*) may be obtained based on a subset of information 16084 having the same index value and a subset of information 1610-(J−1) having a preceding index value. In some examples, the preceding index value is one less than the index value of the current subset of information 1610 being obtained or generated. To populate the entire non-systematic block code matrix 1604, the process described above may be successively performed until the last subset of information 1608-J of the systematic block code matrix 1602 has been transformed into a subset of information 1610-J of the non-systematic block code matrix 1604.

In some examples, the non-systematic block code matrix 1604 may perform equally well as the systematic matrix 1602 when the receiving device (e.g., wireless communication device 304 in FIG. 3) does not know any bits or symbols of the information vector (e.g., information vector 314 in FIG. 3). However, the non-systematic block code matrix 1604 may exhibit improved performance over the systematic matrix 1602 when the receiving device (e.g., wireless communication device 304 in FIG. 3) already knows at least one of the bits or symbols of the information vector (e.g., information vector 314 in FIG. 3).

The matrices 1602, 1604 may support a plurality of coded block lengths, a plurality of information vector lengths, a plurality of resultant vector lengths, or a plurality of codeword vector lengths. The techniques for transforming a systematic block code matrix 1602 to a non-systematic block code matrix 1604 may be used with matrices of any dimension (e.g., having input/output vector lengths of any size).

Figure 17:
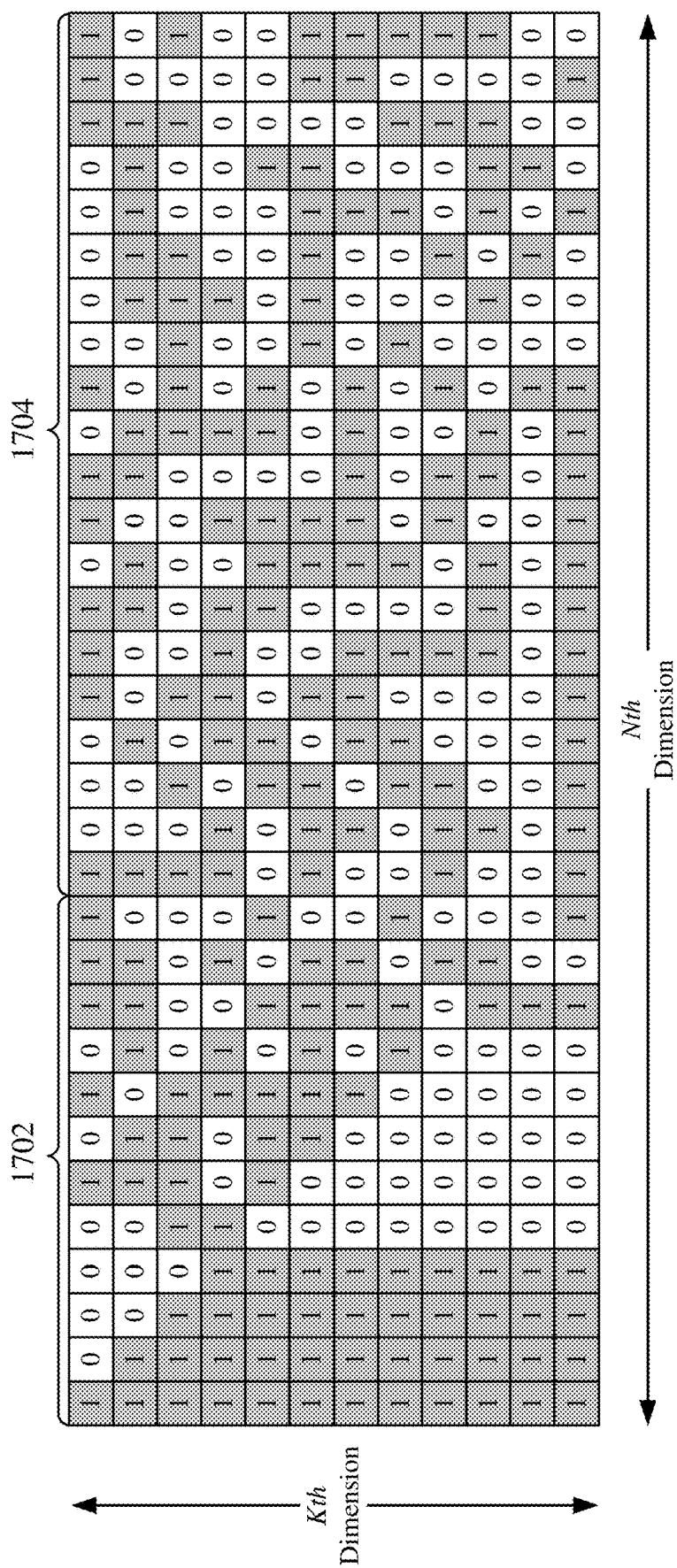
FIG. 17 is an example of a non-systematic generator matrix according to at least one example.

FIG. 17 illustrates an example of a non-systematic block code obtained from the systematic block code of FIG. 7. The non-systematic Golay-based generator matrix in FIG. 17 may be an example of a non-systematic matrix obtained using the process or transform described with reference to FIG. 16. As such, the non-systematic Golay-based generator matrix of FIG. 17 may be based on the systematic Golay-based generator matrix of FIG. 7. The systematic Golay-based generator matrix of FIG. 7 includes an identity portion (e.g., systematic bits) 702 and an error detection/correction portion (e.g., parity check bits) 704.

The non-systematic Golay-based generator matrix in FIG. 17 may include a first portion (e.g., systematic bits) 1702 and a second portion (e.g., parity check bits) 1704. The first portion 1702 may be based on the identity portion 702 of the systematic Golay-based generator matrix in FIG. 7. The second portion 1704 may be an error detection/correction portion (e.g., parity check bits) that is based on the error detection/correction portion 704 of the systematic Golay-based generator matrix in FIG. 7. In the illustrative example, the non-systematic Golay-based generator matrix of FIG. 17 is a 12×32 Golay-based array. The non-systematic Golay-based generator matrix may be an example of the non-systematic block code matrix 1604 described with reference to FIG. 16. In some examples, the non-systematic Golay-based block codes may provide a coding gain for known bits or symbols as well as unknown bits or symbols. For example, where known bits or symbols are interspersed among unknown bits or symbols in the information vector, codeword bits will generally depend on both known and unknown bits of the information vector. In some examples, an information vector may be interleaved before coding using the non-systematic Golay-based block code to break up blocks of known bits.

Although not found in the example depicted in FIG. 17, some examples may include a first portion 1702 with a line of symmetry dividing the first portion into two sections. Such a first section of the first portion 1702 may include bits or symbols of a first type (e.g., logic '1'), and a second section of the first portion 1702 may include bits or symbols of a second type (e.g., logic '0') different from the first type. In some examples, the first portion 1702 may include a plurality of vectors of identical bits or symbols. For example, a first column vector of the first portion 1702 may include a first bit or symbol in every data position. A second column vector of the first portion 1702 may include a second bit or symbol in every data position. In some examples, the second column vector of the first portion 1702 may be a different length than the first column vector of the first portion 1702.

The generator matrix in FIG. 17 can be transposed in the form shown in FIG. 18. An encoder can be configured to encode data bits utilizing the generator matrix in FIG. 18 with the equation C for implementations where N=24 and K is between 2 and 12, and with the equation D for implementations where N=20 and K is between 2 and 12.

$$N = 24 \text{ or } 32, K = 2 \sim 12, i = 0 \sim N-1: \quad\quad C$$

$$b_i = \begin{cases} \sum_{n=0}^{K-1} o_i & (i < K) \\ \sum_{n=0}^{K-1} (o_n \cdot M_{i,n}) \mod 2 & (i \geq K) \end{cases}$$

$$N = 20, K = 2 \sim 12, i = 0 \sim N-1: \quad\quad D$$

$$b_i = \begin{cases} \sum_{n=0}^{K-1} o_i & (i < K) \\ \sum_{n=0}^{K-1} (o_n \cdot M_{i,n}) \mod 2 & \left(i \geq Ki' = \begin{cases} i, i < 8 \\ i+4, i \geq 8 \end{cases}\right) \end{cases}$$

In the equations C and D, the variables represent the same variables as noted above. Specifically, N is the number of encoded bits, K is the number of information bits (e.g., length of the information vector 314), $b_i$ is the output bit or symbol at index i, $o_n$ represents the current input bit or symbol for the index n=0 through n=K−1.

As noted above, with a generator matrix obtained by one or more of the foregoing processes, a device can use Golay coding utilizing the generator matrix by utilizing one of equations A, B, C, or D above in cooperation with a relevant table, such as the tables depicted in FIGS. 6 and 18. While the equations A and B cooperate with the table in FIG. 6 to define systematic Golay-based generator matrices, and the equations C and D cooperate with the table in FIG. 18 to define non-systematic Golay-based generator matrices for output vector lengths of 20, 24, and 32 bits or symbols, other matrices may be defined in a similar fashion. For example, equations and tables may be used to define systematic and non-systematic Golay-based parity check matrices. In other examples, equations and tables may be used to define non-systematic matrices based on other types of systematic block codes (e.g., Reed-Muller, Reed-Solomon, etc.). In other examples, equations and tables may be used to define non-systematic matrices based on other lengths of output vectors.

Figure 19:
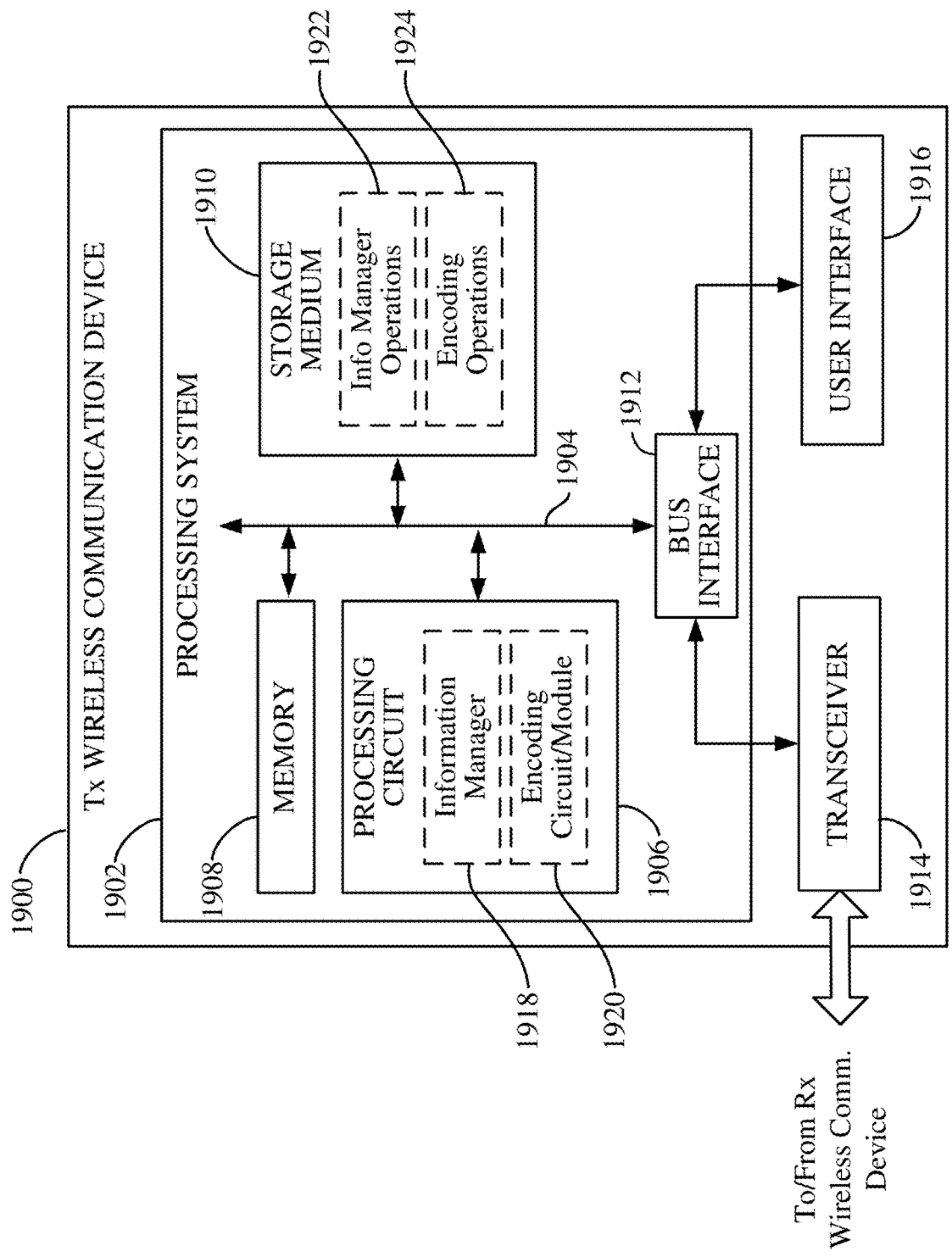
FIG. 19 is a block diagram illustrating an example of a hardware implementation for a wireless communication device employing a processing system.

FIG. 19 is a block diagram illustrating an example of a hardware implementation for a transmitting wireless communication device 1900, such as a scheduled entity or a scheduling entity, employing a processing system 1902 according to at least one example of the present disclosure. In this example, the processing system 1902 is implemented with a bus architecture, represented generally by the bus 1904. The bus 1904 may include any number of interconnecting buses and bridges depending on the specific application of the processing system 1902 and the overall design constraints. The bus 1904 communicatively couples together various circuits including one or more processors (represented generally by the processing circuit 1906), a memory 1908, and computer-readable media (represented generally by the storage medium 1910). The bus 1904 may also link various other circuits such as timing sources, peripherals, voltage regulators, and power management circuits, which are well known in the art, and therefore, will not be described any further. A bus interface 1912 provides an interface between the bus 1904 and a transceiver 1914. The transceiver 1914 provides a means for communicating with various other apparatus over a transmission medium. Depending upon the nature of the apparatus, a user interface 1916 (e.g., keypad, display, speaker, microphone, joystick) may also be provided.

The processing circuit 1906 is responsible for managing the bus 1904 and general processing, including the execution of programming stored on the computer-readable storage medium 1910. The programming, when executed by the processing circuit 1906, causes the processing system 1902 to perform the various functions described below for any particular apparatus. The computer-readable storage medium 1910 and the memory 1908 may also be used for storing data that is manipulated by the processing circuit 1906 when executing programming. As used herein, the term "programming" shall be construed broadly to include without limitation instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1906 is arranged to obtain, process and/or send data, control data access and storage, issue commands, and control other desired operations. The processing circuit 1906 may include circuitry adapted to implement desired programming provided by appropriate media, and/or circuitry adapted to perform one or more functions described in this disclosure. For example, the processing circuit 1906 may be implemented as one or more processors, one or more controllers, and/or other structure configured to execute executable programming and/or execute specific functions. Examples of the processing circuit 1906 may include a general purpose processor, a digital signal processor (DSP), an application specific integrated circuit (ASIC), a field programmable gate array (FPGA) and/or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1906 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1906 are for illustration and other suitable configurations within the scope of the present disclosure are also contemplated.

In some instances, the processing circuit 1906 may include an information manager 1918 and an encoding circuit and/or module 1920. The information manager 1918 may generally include circuitry and/or programming (e.g., programming stored on the storage medium 1910) adapted to identify an information vector to be transmitted via a wireless communication link. The encoding circuit/module 1920 may generally include circuitry and/or programming (e.g., programming stored on the storage medium 1910) adapted to determine a codeword based on the information vector by encoding the information vector using a Golay-based generator matrix selected in response to the information vector, where the Golay-based generator matrix is generated as described herein. As used herein, reference to circuitry and/or programming may be generally referred to as logic (e.g., logic gates and/or data structure logic).

The storage medium 1910 may represent one or more computer-readable devices for storing programming, such as processor executable code or instructions (e.g., software, firmware), electronic data, databases, or other digital information. The storage medium 1910 may also be used for storing data that is manipulated by the processing circuit 1906 when executing programming. The storage medium 1910 may be any available non-transitory media that can be accessed by a general purpose or special purpose processor, including portable or fixed storage devices, optical storage devices, and various other mediums capable of storing, containing and/or carrying programming By way of example and not limitation, the storage medium 1910 may include a non-transitory computer-readable storage medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other mediums for storing programming, as well as any combination thereof.

The storage medium 1910 may be coupled to the processing circuit 1906 such that the processing circuit 1906 can read information from, and write information to, the storage medium 1910. That is, the storage medium 1910 can be coupled to the processing circuit 1906 so that the storage medium 1910 is at least accessible by the processing circuit 1906, including examples where the storage medium 1910 is integral to the processing circuit 1906 and/or examples where the storage medium 1910 is separate from the processing circuit 1906 (e.g., resident in the processing system 1902, external to the processing system 1902, distributed across multiple entities).

Programming stored by the storage medium 1910, when executed by the processing circuit 1906, can cause the processing circuit 1906 to perform one or more of the various functions and/or process steps described herein. In at least some examples, the storage medium 1910 may include information manager operations 1922 and/or encoding operations 1924. The information manager operations 1922 are generally adapted to cause the processing circuit 1906 to identify an information vector to be transmitted via the transceiver 1914, as described herein. The encoding operations 1924 are generally adapted to determine a codeword based on the information vector by encoding the information vector using a Golay-based generator matrix selected in response to the information vector, where the Golay-based generator matrix is generated, as described herein.

Thus, according to one or more aspects of the present disclosure, the processing circuit 1906 is adapted to perform (independently or in conjunction with the storage medium 1910) any or all of the processes, functions, steps and/or routines for any or all of the transmitting wireless communication devices described herein. As used herein, the term "adapted" in relation to the processing circuit 1906 may refer to the processing circuit 1906 being one or more of configured, employed, implemented, and/or programmed (in conjunction with the storage medium 1910) to perform a particular process, function, step and/or routine according to various features described herein.

Figure 20:
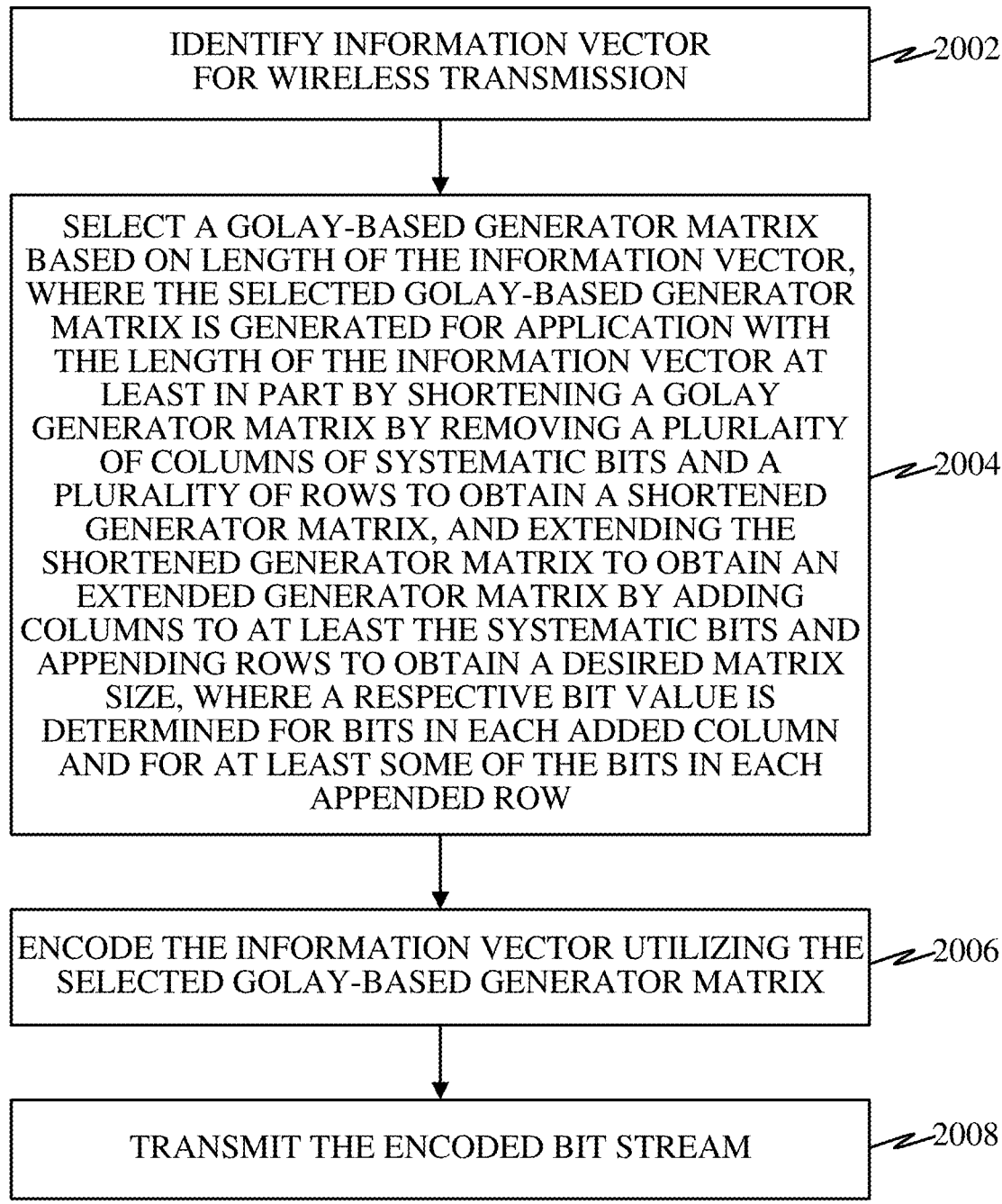
FIG. 20 is a flow diagram depicting a method operational on a wireless communication device according to at least one example.

FIG. 20 is a flow diagram depicting a method operational on a wireless communication device, such as the wireless communication device 1900, according to at least one example. Referring to FIGS. 19 and 20, a wireless communication device 1900 may identify an information vector (e.g., a data stream) for transmission as a wireless communication at 2002. For example, the processing circuit 1906 may include logic (e.g., information manager 1918 and/or information manager operations 1922) to identify an information vector or bit stream for transmission as a wireless communication.

At 2004, the wireless communication device 1900 may select a Golay-based generator matrix based on a length of the information vector. For example, the processing circuit 1906 may include logic (e.g., encoding circuit/module 1920 and/or encoding operations 1924) to select a Golay-based generator matrix based on the length of the information vector. The selected Golay-based generator matrix may be generated for use with information vectors exhibiting a length matching the length of the information vector identified at step 2002 for transmission.

According to one or more aspects of the present disclosure, the selected Golay-based generator matrix is generated according to one or more examples described herein with reference to FIGS. 8 through 18. For example, generating the selected Golay-based generator matrix may include shortening a Golay generator matrix by removing a plurality of columns of systematic bits and a plurality of rows according to the length(s) of information vectors for which it is intended for use to obtain the shortened generator matrix. The shortened generator matrix can then be extended by adding columns to at least the systematic bits and appending rows to obtain a desired matrix size to obtain an extended generator matrix. A respective bit value can be determined for bits in each added column and for at least some of the bits in each appended row as described above with reference to FIGS. 8 through 15.

The selected Golay-based generator matrix may further be generated by partitioning the extended generator matrix into a plurality of subsets along a first dimension, obtaining a first subset of a non-systematic extended generator matrix based on a first subset of the extended generator matrix, and obtaining a second subset of the non-systematic extended generator matrix based on a second subset of the extended generator matrix and the first subset of the non-systematic extended generator matrix, as described above with reference to FIGS. 16 through 18.

In some embodiments, the selected Golay-based generator matrix may be generated by the processing circuit 1906. For instance, the processing circuit 1906 may include logic (e.g., encoding circuit/module 1920 and/or encoding operations 1924) to generate the Golay-based generator matrix according to the process described herein with reference to FIGS. 8 through 18. In other embodiments, the selected Golay-based generator matrix may be generated by a processing circuit of another device, and may be provisioned on the wireless communication device 1900. In still other embodiments, the selected Golay-based generator matrix may be generated by a processing circuit of another device, and subsequently received by the wireless communication device 1900 from the other device, such as via the transceiver 1914.

At 2006, the wireless communication device 1900 can encode the information vector utilizing the selected Golay-based generator matrix. For example, the processing circuit 1906 may include logic (e.g., encoding circuit/module 1920 and/or encoding operations 1924) to encode the information vector utilizing the selected Golay-based generator matrix.

At 2008, the wireless communication device 1900 can transmit the encoded information vector as a codeword. For example, the processing circuit 1906 may include logic to transmit the codeword generated by encoding the information vector utilizing the transceiver 1914.

Several aspects of a wireless communication network have been presented with reference to an exemplary implementation. As those skilled in the art will readily appreciate, various aspects described throughout this disclosure may be extended to other telecommunication systems, network architectures and communication standards. By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

While the above discussed aspects, arrangements, and embodiments are discussed with specific details and particularity, one or more of the components, steps, features and/or functions illustrated in FIGS. 1, 2, 3, 4, 5, 6, 7, 8, 9, 10, 11, 12, 13, 14, 15, 16, 17, 18, 19, and/or 20 may be rearranged and/or combined into a single component, step, feature or function or embodied in several components, steps, or functions. Additional elements, components, steps, and/or functions may also be added or not utilized without departing from the present disclosure. One or more of the apparatus, devices and/or components described herein may be configured to perform or employ one or more of the methods, features, parameters, and/or steps described herein. The novel algorithms described herein may also be efficiently implemented in software and/or embedded in hardware.

While features of the present disclosure may have been discussed relative to certain embodiments and figures, all embodiments of the present disclosure can include one or more of the advantageous features discussed herein. In other words, while one or more embodiments may have been discussed as having certain advantageous features, one or more of such features may also be used in accordance with any of the various embodiments discussed herein. In similar fashion, while exemplary embodiments may have been discussed herein as device, system, or method embodiments, it should be understood that such exemplary embodiments can be implemented in various devices, systems, and methods.

Also, it is noted that at least some implementations have been described as a process that is depicted as a flowchart, a flow diagram, a structure diagram, or a block diagram.

Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. The various methods described herein may be partially or fully implemented by programming (e.g., instructions and/or data) that may be stored in a processor-readable storage medium, and executed by one or more processors, machines and/or devices.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The various features associate with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

What is claimed is:

1. A wireless communication device, comprising:
   a transceiver;
   a memory; and
   a processing circuit communicatively coupled to the transceiver and the memory, the processing circuit configured to:
   identify an information vector to be transmitted as a wireless communication,
   select a Golay-based generator matrix based on a length of the information vector, wherein the selected Golay-based generator matrix is generated at least in part by shortening a Golay generator matrix by removing a plurality of columns of systematic bits and a plurality of rows to obtain a shortened generator matrix, and extending the shortened generator matrix to obtain an extended generator matrix by adding columns to at least the systematic bits and appending rows to obtain a desired matrix size, wherein a respective bit value is determined for bits in each added column and for at least some of the bits in each appended row,
   encode the information vector utilizing the selected Golay-based generator matrix, and
   transmit the encoded information vector as a codeword via the transceiver.

2. The wireless communication device of claim 1, wherein extending the shortened generator matrix comprises:
   extending the shortened generator matrix by adding enough columns to the systematic bits to obtain 20 columns;
   determining desired bit values for the systematic bits in each row of the added columns;
   appending new rows one at a time until the generator matrix includes 20 columns and 7 rows (20, 7), wherein desired bit values for at least some of the systematic bits are determined for each new row when appended;
   extending the generator matrix to 24 columns (24, 7) by adding 4 additional columns;
   determining desired bit values for the systematic bits in each row of the 4 additional columns; and
   appending new rows one at a time until the generator matrix includes 24 columns and 12 rows (24, 12), wherein desired bit values for last several bits are determined for each new row when appended.

3. The wireless communication device of claim 2, further comprising:
   extending the matrix to 32 columns by adding 8 additional columns of parity bits to the (24, 12) matrix;
   determining desired bit values in first four rows of the 8 additional columns of parity bits; and
   determining desired bit values for last 8 bits of the parity bits in each of remaining 8 rows one row at a time until all 12 rows include bit values for each of the 32 columns.

4. The wireless communication device of claim 2, wherein determining desired bit values comprises:
   determining bit value combinations providing a highest minimal Hamming distance value; and
   when more than one bit value combination provides the same highest minimal Hamming distance value, determining which of the more than one bit value combinations provide a smallest number of low weight codewords.

5. The wireless communication device of claim 1, wherein the selected Golay-based generator matrix is generated for application with the length of the information vector further by:
   partitioning the extended generator matrix into a plurality of subsets along a first dimension;
   obtaining a first subset of a non-systematic extended generator matrix based on a first subset of the extended generator matrix; and
   obtaining a second subset of the non-systematic extended generator matrix based on a second subset of the extended generator matrix and the first subset of the non-systematic extended generator matrix.

6. The wireless communication device of claim 5, wherein the selected Golay-based generator matrix is generated for application with the length of the information vector further by:
   successively obtaining each of a plurality of indexed subsets of the non-systematic extended generator matrix based on a corresponding subset of the extended generator matrix and a subset of the non-systematic extended generator matrix having a preceding index.

7. The wireless communication device of claim 5, wherein the second subset of the non-systematic extended generator matrix is obtained by:
   adding respective bits of the second subset of the extended generator matrix and the first subset of the non-systematic extended generator matrix.

8. The wireless communication device of claim 1, wherein the processing circuit is further configured to generate the Golay-based generator matrix.

9. The wireless communication device of claim 1, wherein the Golay-based generator matrix is one of pre-provisioned in the memory or received from another device.

10. A method of wireless communication, comprising:
identifying an information vector to be transmitted as a wireless communication;
selecting a Golay-based generator matrix based on a length of the information vector, wherein the selected Golay-based generator matrix is generated at least in part by:
shortening a Golay generator matrix by removing a plurality of columns of systematic bits and a plurality of rows to obtain a shortened generator matrix, and
extending the shortened generator matrix to obtain an extended generator matrix by adding columns to at least the systematic bits and appending rows to obtain a desired matrix size, wherein a respective bit value is determined for bits in each added column and for at least some of the bits in each appended row;
encoding the information vector via a processor utilizing the selected Golay-based generator matrix; and
transmitting the encoded information vector as a codeword.

11. The method of claim 10, wherein extending the shortened generator matrix comprises:
extending the shortened generator matrix by adding enough columns to the systematic bits to obtain 20 columns;
determining desired bit values for the systematic bits in each row of the added columns;
appending new rows one at a time until the generator matrix includes 20 columns and 7 rows (20, 7), wherein desired bit values for at least some of the systematic bits are determined for each new row when appended;
extending the generator matrix to 24 columns (24, 7) by adding 4 additional columns;
determining desired bit values for the systematic bits in each row of the 4 additional columns; and
appending new rows one at a time until the generator matrix includes 24 columns and 12 rows (24, 12), wherein desired bit values for last several bits are determined for each new row when appended.

12. The method of claim 11, further comprising:
extending the matrix to 32 columns by adding 8 additional columns of parity bits to the (24, 12) matrix;
determining desired bit values in first four rows of the 8 additional columns of parity bits; and
determining desired bit values for last 8 bits of the parity bits in each of remaining 8 rows one row at a time until all 12 rows include bit values for each of the 32 columns.

13. The method of claim 11, wherein determining desired bit values comprises:
determining bit value combinations providing a highest minimal Hamming distance value; and
when more than one bit value combination provide the same highest minimal Hamming distance value, determining which of the more than one bit value combinations provide a smallest number of low weight codewords.

14. The method of claim 10, wherein the selected Golay-based generator matrix is generated for application with the length of the information vector further by:
partitioning the extended generator matrix into a plurality of subsets along a first dimension;
obtaining a first subset of a non-systematic extended generator matrix based on a first subset of the extended generator matrix; and
obtaining a second subset of the non-systematic extended generator matrix based on a second subset of the extended generator matrix and the first subset of the non-systematic extended generator matrix.

15. The method of claim 14, wherein the selected Golay-based generator matrix is generated for application with the length of the information vector further by successively obtaining each of a plurality of indexed subsets of the non-systematic extended generator matrix based on a corresponding subset of the extended generator matrix and a subset of the non-systematic extended generator matrix having a preceding index.

16. The method of claim 14, wherein obtaining the second subset of the non-systematic extended generator matrix comprises:
adding respective bits of the second subset of the extended generator matrix and the first subset of the non-systematic extended generator matrix.

17. A wireless communication device, comprising:
means for identifying an information vector to be transmitted via a wireless communication;
means for selecting a Golay-based generator matrix based on a length of the information vector, wherein the selected Golay-based generator matrix is generated at least in part by:
shortening a Golay generator matrix by removing a plurality of columns of systematic bits and a plurality of rows to obtain a shortened generator matrix, and
extending the shortened generator matrix to obtain an extended generator matrix by adding columns to at least the systematic bits and appending rows to obtain a desired matrix size, wherein a respective bit value is determined for bits in each added column and for at least some of the bits in each appended row;
means for encoding the information vector via a processor utilizing the selected Golay-based generator matrix, the encoded information vector resulting in a codeword; and
means for transmitting the codeword.

18. The wireless communication device of claim 17, wherein extending the shortened generator matrix comprises:
extending the shortened generator matrix by adding enough columns to the systematic bits to obtain 20 columns;
determining desired bit values for the systematic bits in each row of the added columns;
appending new rows one at a time until the generator matrix includes 20 columns and 7 rows (20, 7), wherein desired bit values for at least some of the systematic bits are determined for each new row when appended;
extending the generator matrix to 24 columns (24, 7) by adding 4 additional columns;
determining desired bit values for the systematic bits in each row of the 4 additional columns; and
appending new rows one at a time until the generator matrix includes 24 columns and 12 rows (24, 12), wherein desired bit values for last several bits are determined for each new row when appended.

19. The wireless communication device of claim 18, further comprising:
- extending the matrix to 32 columns by adding 8 additional columns of parity bits to the (24, 12) matrix;
- determining desired bit values in first four rows of the 8 additional columns of parity bits; and
- determining desired bit values for last 8 bits of the parity bits in each of remaining 8 rows one row at a time until all 12 rows include bit values for each of the 32 columns.

20. The wireless communication device of claim 18, wherein determining desired bit values comprises:
- determining bit value combinations providing a highest minimal Hamming distance value; and
- when more than one bit value combination provide the same highest minimal Hamming distance value, determining which of the more than one bit value combinations provide a smallest number of low weight codewords.

21. The wireless communication device of claim 17, wherein the selected Golay-based generator matrix is generated for application with the length of the information vector further by:
- partitioning the extended generator matrix into a plurality of subsets along a first dimension;
- obtaining a first subset of a non-systematic extended generator matrix based on a first subset of the extended generator matrix; and
- obtaining a second subset of the non-systematic extended generator matrix based on a second subset of the extended generator matrix and the first subset of the non-systematic extended generator matrix.

22. The wireless communication device of claim 21, wherein the selected Golay-based generator matrix is generated for application with the length of the information vector further by successively obtaining each of a plurality of indexed subsets of the non-systematic extended generator matrix based on a corresponding subset of the extended generator matrix and a subset of the non-systematic extended generator matrix having a preceding index.

23. The wireless communication device of claim 21, wherein obtaining the second subset of the non-systematic extended generator matrix comprises:
- adding respective bits of the second subset of the extended generator matrix and the first subset of the non-systematic extended generator matrix.

24. A non-transitory processor-readable storage medium storing processor-executable programming for causing a processing circuit to:
- identify an information vector to be transmitted as a wireless communication;
- select a Golay-based generator matrix based on a length of the information vector, wherein the selected Golay-based generator matrix is generated at least in part by:
  - shortening a Golay generator matrix by removing a plurality of columns of systematic bits and a plurality of rows to obtain a shortened generator matrix, and
  - extending the shortened generator matrix to obtain an extended generator matrix by adding columns to at least the systematic bits and appending rows to obtain a desired matrix size, wherein a respective bit value is determined for bits in each added column and for at least some of the bits in each appended row;
- encode the information vector utilizing the selected Golay-based generator matrix; and
- transmit the encoded information vector.

25. The processor-readable storage medium of claim 24, wherein extending the shortened generator matrix comprises:
- extending the shortened generator matrix by adding enough columns to the systematic bits to obtain 20 columns;
- determining desired bit values for the systematic bits in each row of the added columns;
- appending new rows one at a time until the generator matrix includes 20 columns and 7 rows (20, 7), wherein desired bit values for at least some of the systematic bits are determined for each new row when appended;
- extending the generator matrix to 24 columns (24, 7) by adding 4 additional columns;
- determining desired bit values for the systematic bits in each row of the 4 additional columns; and
- appending new rows one at a time until the generator matrix includes 24 columns and 12 rows (24, 12), wherein desired bit values for last several bits are determined for each new row when appended.

26. The processor-readable storage medium of claim 25, wherein extending the shortened generator matrix further comprises:
- extending the matrix to 32 columns by adding 8 additional columns of parity bits to the (24, 12) matrix;
- determining desired bit values in first four rows of the 8 additional columns of parity bits; and
- determining desired bit values for last 8 bits of the parity bits in each of remaining 8 rows one row at a time until all 12 rows include bit values for each of the 32 columns.

27. The processor-readable storage medium of claim 25, wherein determining desired bit values comprises:
- identifying bit value combinations providing a highest minimal Hamming distance value; and
- when more than one bit value combination provide the same highest minimal Hamming distance value, determining which of the more than one bit value combinations provide a smallest number of low weight codewords.

28. The processor-readable storage medium of claim 24, wherein the selected Golay-based generator matrix is generated for application with the length of the information vector further by:
- partitioning the extended generator matrix into a plurality of subsets along a first dimension;
- obtaining a first subset of a non-systematic extended generator matrix based on a first subset of the extended generator matrix; and
- obtaining a second subset of the non-systematic extended generator matrix based on a second subset of the extended generator matrix and the first subset of the non-systematic extended generator matrix.

29. The processor-readable storage medium of claim 28, wherein the selected Golay-based generator matrix is generated for application with the length of the information vector further by:
- successively obtaining each of a plurality of indexed subsets of the non-systematic extended generator matrix based on a corresponding subset of the extended generator matrix and a subset of the non-systematic extended generator matrix having a preceding index.

30. The processor-readable storage medium of claim 28, wherein obtaining the second subset of the non-systematic extended generator matrix comprises:

adding respective bits of the second subset of the extended generator matrix and the first subset of the non-systematic extended generator matrix.

\* \* \* \* \*